United States Patent
Alvarez, Jr. et al.

(10) Patent No.: US 7,377,982 B2
(45) Date of Patent: *May 27, 2008

(54) METHOD FOR THE REMOVAL OF AIRBORNE MOLECULAR CONTAMINANTS USING WATER GAS MIXTURES

(75) Inventors: Daniel Alvarez, Jr., San Diego, CA (US); Jeffrey J Spiegelman, San Diego, CA (US)

(73) Assignee: Entegris, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/113,726

(22) Filed: Apr. 25, 2005

(65) Prior Publication Data

US 2005/0205114 A1    Sep. 22, 2005

Related U.S. Application Data

(63) Continuation of application No. 10/683,904, filed on Oct. 10, 2003, now Pat. No. 6,913,654.

(60) Provisional application No. 60/475,145, filed on Jun. 2, 2003.

(51) Int. Cl.
*B08B 3/00* (2006.01)

(52) U.S. Cl. .............................. 134/26; 134/2; 134/10; 134/11; 134/21; 134/22.1; 134/22.11; 134/30; 134/34; 134/36; 134/37; 134/42

(58) Field of Classification Search ............ 134/2, 134/10, 11, 21, 22.1, 22.11, 26, 30, 34, 36, 134/37, 42
See application file for complete search history.

(56) References Cited

U.S. PATENT DOCUMENTS 5,013,335 A    5/1991  Marcus
5,160,512 A   11/1992  Talu
5,230,721 A    7/1993  Ohmi
5,351,415 A   10/1994  Brooks et al.

(Continued)

FOREIGN PATENT DOCUMENTS

DE    199 24 058 A1    11/2000

(Continued)

OTHER PUBLICATIONS

Handbook of Semiconductor Wafer Cleaning Technology, Science, Technology, and Applications, Werner Kern Associates, eds., (NJ: Noyes Publications) pp. 88-89 (1993).

(Continued)

*Primary Examiner*—Sharidan Carrillo
(74) *Attorney, Agent, or Firm*—Hamilton, Brook, Smith & Reynolds, P.C.

(57) ABSTRACT

The present invention discloses a method for the removal of a number of molecular contaminants from surfaces within a device. A purge gas containing oxygen and/or water is introduced into the interior of the device, contacting at least a portion of the interior surfaces. A contaminated purge gas is produced by transferring a portion of the contamination from the interior surfaces into the purge gas. The contaminated purge gas is removed from the device and the process is continued until the contaminant concentration in the contaminated purge gas is below a predetermined level.

24 Claims, 19 Drawing Sheets

U.S. PATENT DOCUMENTS

| | | | |
|---|---|---|---|
| 5,540,757 A | 7/1996 | Jordan, Sr. | |
| 5,602,683 A | 2/1997 | Straaijer et al. | |
| 5,661,225 A | 8/1997 | Ridgeway et al. | |
| 5,676,737 A | 10/1997 | Whitlock | |
| 5,833,738 A | 11/1998 | Carrea et al. | |
| 5,846,338 A | 12/1998 | Bonora et al. | |
| 5,869,401 A | 2/1999 | Brunemeier et al. | |
| 5,938,854 A | 8/1999 | Roth | |
| 5,968,232 A | 10/1999 | Whitlock | |
| 6,124,211 A | 9/2000 | Butterbaugh et al. | |
| 6,221,132 B1 | 4/2001 | Dong et al. | |
| 6,391,090 B1 | 5/2002 | Alvarez, Jr. et al. | |
| 6,427,703 B1 | 8/2002 | Somekh | |
| 6,461,410 B1 | 10/2002 | Abe et al. | |
| 6,507,390 B1* | 1/2003 | Ivaldi | 355/75 |
| 6,610,123 B2 | 8/2003 | Wu et al. | |
| 6,638,341 B1 | 10/2003 | Spiegelman et al. | |
| 6,710,845 B2* | 3/2004 | Wu et al. | 355/30 |
| 6,724,460 B2 | 4/2004 | Van Schaik et al. | |
| 6,729,041 B2 | 5/2004 | Shindo et al. | |
| 6,747,729 B2* | 6/2004 | Pril et al. | 355/30 |
| 6,913,654 B2* | 7/2005 | Alvarez et al. | 134/11 |
| 7,113,254 B2 | 9/2006 | Van Der Net et al. | |
| 2002/0018189 A1 | 2/2002 | Mulkens et al. | |
| 2002/0088478 A1 | 7/2002 | Degendt et al. | |
| 2002/0132480 A1 | 9/2002 | Shindo et al. | |
| 2002/0192129 A1 | 12/2002 | Shamouilian et al. | |
| 2003/0096193 A1 | 5/2003 | Van Schaik et al. | |
| 2004/0145716 A1 | 7/2004 | Wu et al. | |
| 2004/0237777 A1 | 12/2004 | Alvarez et al. | |
| 2004/0238013 A1 | 12/2004 | Spiegelman et al. | |
| 2005/0017198 A1 | 1/2005 | Van Der Net et al. | |
| 2006/0285091 A1 | 12/2006 | Parekh et al. | |
| 2007/0030463 A1 | 2/2007 | Parekh et al. | |
| 2007/0114467 A1 | 5/2007 | Van Der Net et al. | |
| 2007/0144118 A1 | 6/2007 | Alvarez, Jr. et al. | |

FOREIGN PATENT DOCUMENTS

| | | |
|---|---|---|
| EP | 0 867 924 A2 | 9/1998 |
| WO | WO 01/37329 A1 | 5/2001 |
| WO | WO 2005/008339 A2 | 1/2005 |
| WO | WO 2005/010619 | 2/2005 |
| WO | WO 2005/078771 A2 | 8/2005 |
| WO | WO 2007/019105 A1 | 2/2007 |
| WO | WO 2007/120451 A1 | 10/2007 |

OTHER PUBLICATIONS

Veillerot, Marc, "A Method for Measuring AMC Concentrations Inside Wafer Containers," Materials Integrity Management Symposium 2003.

Martin, Ray et al., "Status of Microenvironment Gas Purge in the Semiconductor Industry," Materials Integrity Management Symposium 2003.

Davidson, John, "The Expanding Role of Bare Reticle Stockers in Photolithography," Materials Integrity Management Symposium 2003.

Veillerot et al., "Organic Contamination: Purge Gas Impace in Plastic Storage Boxes," Solid State Phenomena, vol. 92, pp. 105-108 (2003).

Veillerot et al., "Testing the use of purge gas in wafer storage and transport containers," [online] 1997-2003 [retrieved Nov. 10, 2004]. Retrieved from the Internet <URL: http://www.micromagazine.com/archive/03/08/verllerot.html.

Pearlstein et al., "Evaluating electronics-grade gas-line purging requirements," [online] Mar. 2001 [retrieved Oct. 18, 2004]. Retrieved from the Internet <URL: http://sst.pennnet.com/Articles/Article_Display.cfm?Section=ARCHI&ARTICLE_ID=95491&VERSION_NUM=1&p=5.

* cited by examiner

Wafer Chamber

METHOD FOR THE REMOVAL OF AIRBORNE MOLECULAR CONTAMINANTS USING WATER GAS MIXTURES

CROSS-REFERENCES TO RELATED APPLICATIONS

This application is a continuation of U.S. application Ser. No.: 10/683,904, filed Oct. 10, 2003 now U.S. Pat. No. 6,913,654, which claims the benefit of U.S. Provisional Application No.: 60/475,145, filed Jun. 2, 2003. This application is also related to U.S. application Ser. No.: 10/683,903, filed Oct. 10, 2003 now U.S. Pat. No. 7,189,291. The contents of all these applications are hereby incorporated herein by reference in their entirety.

FIELD OF THE INVENTION

The present invention generally relates to the purging of high purity components to remove contamination. More specifically, the present invention provides a method for removing airborne molecular contaminants from internal surfaces of high purity components and silicon substrates using purge gasses containing oxygen and/or water.

BACKGROUND OF THE INVENTION

In the manufacture of high purity products such as silicon wafers intended for semiconductor substrates or in the photolithography steps of manufacture of semiconductors, it is necessary to maintain a high degree of cleanliness. The products themselves must be clean, the atmospheres surrounding them throughout the manufacturing process must be clean, and the steps and equipment used in the manufacture must not impair cleanliness. It is well known that with the minute sizes of circuitry and components incorporated into semiconductor chips, even extremely small contaminant particles when deposited on chip surfaces are destructive of the chips. It is common for loss rates of wafers and chips during manufacturing due to system contamination to be a significant portion of the total production.

Manufacturers of wafers and chips have been engaged in extensive and continual efforts to improve on the cleanliness of their fabrication facilities ("fabs") including efforts to have manufacturing and process materials and gases be of high purity. Such efforts have been generally successful in the past, in that gases with purities defined by contaminant levels in the parts per million (ppm) and even into the parts per billion (ppb) ranges have been achieved. Generally improvements in process system cleanliness have paralleled increases in the component density of chips and reductions in the size of chip components and circuitry.

However, the ability of the prior art to achieve such parallel improvements in gases has more recently been severely taxed as the size of chip components has continued to decrease and component density has continued to increase. With the movement to 198 nm and 157 nm semiconductor technologies the ability of the products to tolerate contamination has substantially decreased, and process gases which previously were of adequate purities are no longer suitable. Scale-up techniques which previously achieved adequate improvements in the purity of such gases have been found to be ineffective in these "ultra high purity" (UHP) systems in which the lower nm level technologies are produced. Further, at the lower levels materials which were previously considered minor contaminants have been found to act as major contaminants, and the prior art gases have been found to be ineffective in removing such contaminant materials.

Ultrahigh purity products and process tools are susceptible to airborne molecular contaminants (AMCs) that can reduce product quality and yield. AMCs include, but are not limited to SOx, NOx, siloxanes, organophosphates, ammonia, moisture, oxygen and hydrocarbons (>4 carbons).

In the production of wafers for the semiconductor industry, there are three major sources of contamination, wafer storage containers (also known as foups) themselves; clean room air that enters the container as the wafers are moved between tools and the wafers themselves that may leech contaminants during the manufacturing and photolithography process. Methods have been developed to sufficiently reduce water and oxygen contamination in the manufacturing process. Additionally, methods have been developed for the removal of reaction products of the wafer with water and oxygen (e.g. silicon oxides) that can form on the surface of the wafers. However, technologies have not developed for the efficient removal of a number of airborne contaminants and their resulting reaction products on wafers.

Various contaminants have different effects. For example, in photolithography simple hydrocarbons that can condense on the lens assembly and result in transmission loss. Heavy hydrocarbons and significant concentrations of light hydrocarbons irreversibly deposit on optical surfaces and become graphitized by ultraviolet (UV) exposure. In a similar manner, Si containing organics, e.g. siloxanes, react under UV irradiation to produce $SiO_2$ crystallites that refract and absorb the incident light. Other AMCs, e.g. $NO_x$ and $SO_x$, typically wherein $0<x\leq3$, cause optical hazing. Basic AMCs, e.g. amines, quench the photoacids, in addition to causing optical hazing. In the context of photolithography, oxygen and water can be deteremental to the production process and are typically to be considered AMCs. Recently, its has been reported by Veillerot et al. (Solid State Phenomena Vol. 92, 2003, pp 105-108) that atmospheric hydrocarbon contamination has a detrimental impact on 4.5 nm gate oxide integrity.

Approaches being tried to reduce this contamination include large-scale chemical filtration of the cleanroom air, moving from open to closed cassettes, and nitrogen purging of wafers during storage and transport. Nitrogen purging of UHP (Ultra High Purity) components such as valves and gas delivery piping, has been practiced for many years, and can be effective in removing oxygen and water. However, large scale use of nitrogen for purging large volume IC process equipment and large numbers of cassettes can be expensive and present a serious asphyxiation hazard. Additionally, it is suspected that nitrogen purging of hydrocarbon contaminated surfaces is not completely effective in removing the hydrocarbons.

Methods for analysis of contaminants in gas streams are well known. FIG. 1 (Prior Art) is a schematic flow diagram of a double dilution system 100 coupled to a gas chromatograph gas analysis system 120. The double dilution system 100 comprising mass flow controllers 106, 108, 110, and 112 enable the precise dilution of a gas standard 114 with a carrier gas 102 over a range of six orders of magnitude ($10^6$). Commonly available gas standards in the part per million (ppm) range can be effectively diluted to the part per trillion (ppt) range with system 100. The dilution system 100 can be coupled to a gas chromatograph system 120 for the purposes of calibrating the response of the chromatograph 126, by connecting the output 116 of the dilution system to the input 122 of the chromatographic gas analysis system 120. A cold trap 124 accumulates condensed hydrocarbons in the sample, prior to injection into the gas chromatograph 126. In this manner, the effective sensitivity of the chromatograph can be increased and ppt level hydrocarbon concentrations reliably measured.

FIG. 2 (Prior Art) is a calibration graph 200 of signal response area 204 versus sample hydrocarbon concentration 202 for various hydrocarbon molecules including benzene 206, toluene 208, ethyl-benzene 210, meta, para-xylene 212, ortho-xylene 214, a second toluene 216, for the analysis system 120 coupled to dilution system 100. The data 220 show a linear response relationship between the peak area 204 and concentration 202 over almost six orders of magnitude, with a minimum sensitivity of 1 ppt.

FIG. 3 (Prior Art) is a graph 300 of time 302 versus gas chromatograph 126 detector signal 304 for a sample containing 1 ppt each of benzene, toluene, ethyl-benzene, and xylene. Here it can be seen that 1 ppt level concentrations for each of the hydrocarbons in the mixture result in clearly distinguished peaks for benzene 306, toluene 308, ethyl-benzene 310, and xylene 312.

SUMMARY OF THE INVENTION

It is an object of the present invention to provide a method for the removal of airborne molecular contaminants (AMCs) from surfaces within a device. In a first embodiment the method comprises the steps of introducing a purge gas containing oxygen and preferably having an AMC concentration of less than 1 part per billion on a volume basis into an interior portion of the device, contacting at least a portion of the surfaces with the purge gas, producing a contaminated purge gas by transferring a portion of the molecular contaminants from the surfaces into the purge gas, removing the contaminated purge gas from the device and, continuing the preceding steps until the contaminant concentration in the contaminated purge gas is decreased to a desired level, preferably below 1 part per billion on a volume basis. Additionally, the oxygen containing purge gas may further include moisture (i.e. water).

In a further embodiment of the present invention, the method comprises the steps of purifying a purge gas containing oxygen at a concentration between 1 and 25 volume %, also preferably having a molecular contaminant concentration of less than 1 ppb, introducing the purified purge gas into an interior portion of the device, contacting at least a portion of the surfaces with the purified purge gas, producing a contaminated purge gas by transferring a portion of the molecular contaminants from the surfaces into the purified purge gas, and removing the contaminated purge gas from said device. The method further comprises the step of continuing the preceding steps until a contaminant concentration in the contaminated purge gas is decreased to a desired level, preferably below 1 ppb. Additionally the oxygen containing purge gas may contain water at a concentration between about 100 ppm to about 2%.

In a third embodiment of the present invention, the method comprises the steps of purifying a purge gas containing water at a concentration between about 100 ppm and about 2% moisture with the overall mixture having a molecular contaminant concentration of less than 1 ppb, introducing the purified purge gas into an interior portion of the device, contacting at least a portion of the surfaces with the purified purge gas, producing a contaminated purge gas by transferring a portion of the molecular contaminants from the surfaces into the purified purge gas, and removing the purified purge gas from said device. The method further comprises the step of continuing the preceding steps until the contaminant concentration of the contaminated purge gas is decreased to a desired level, preferably below 100 ppt contaminant on a volume basis.

BRIEF DESCRIPTION OF THE DRAWINGS

The present invention will be better understood when consideration is given to the following detailed description thereof. Such description makes reference to the annexed drawings, wherein.

DETAILED DESCRIPTION OF THE PREFERRED EMBODIMENTS

Figure 1:
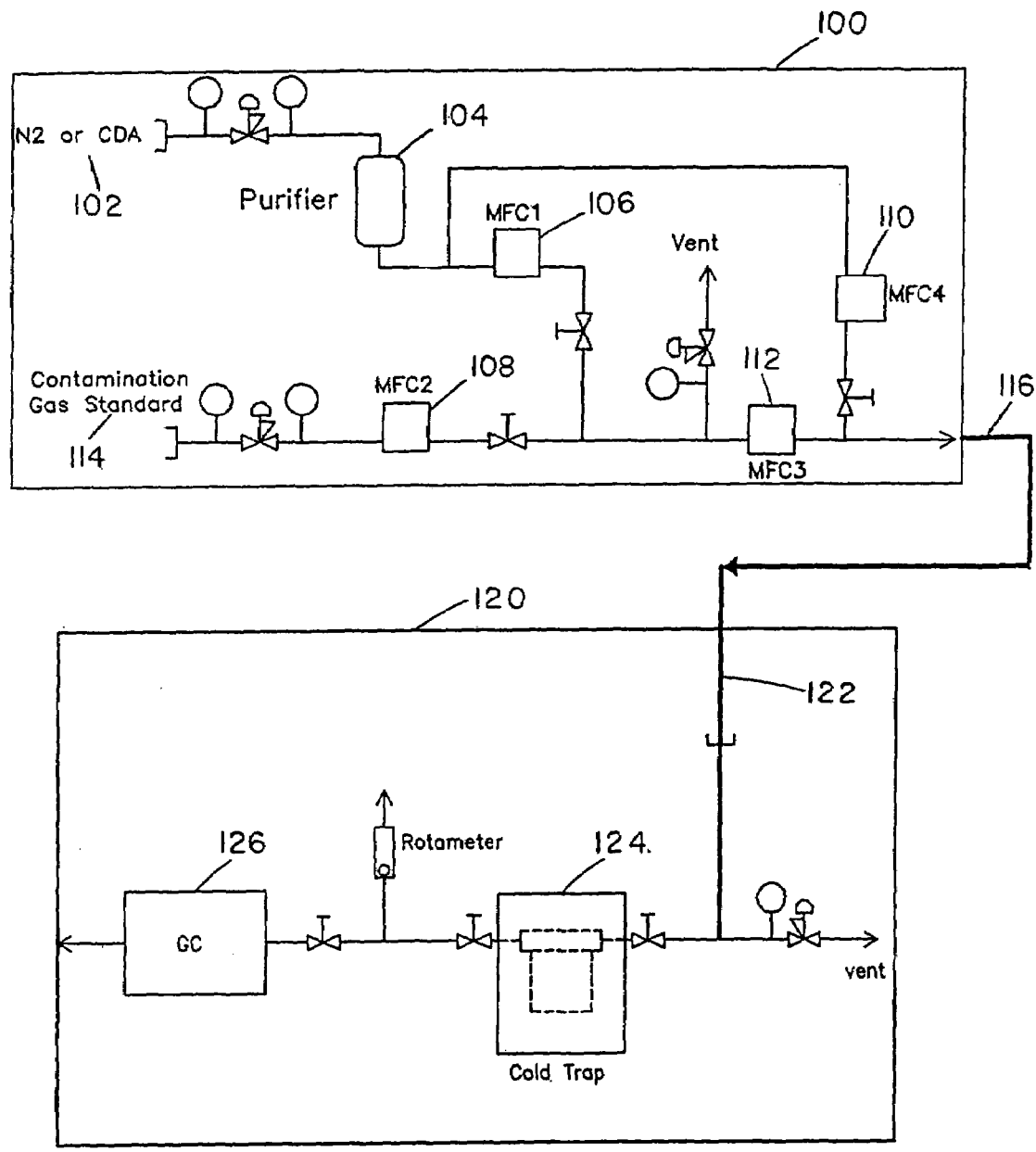
FIG. 1 (Prior Art) is a schematic flow diagram of a double dilution manifold coupled to a gas chromatograph gas analysis system.
Figure 2:
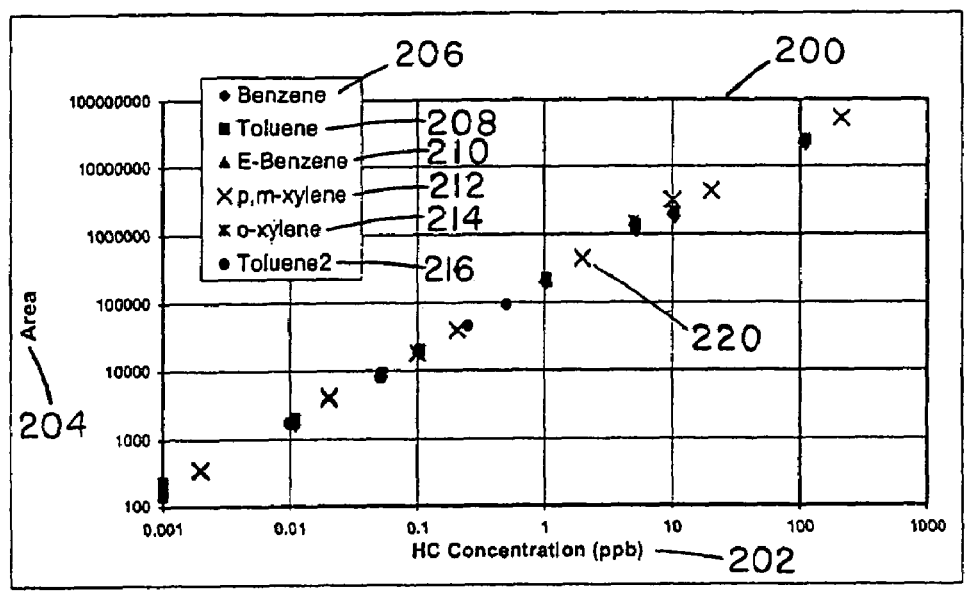
FIG. 2 (Prior Art) is a calibration graph for the apparatus of FIG. 1 showing signal response area versus sample hydrocarbon concentration for various hydrocarbon molecules.
Figure 3:
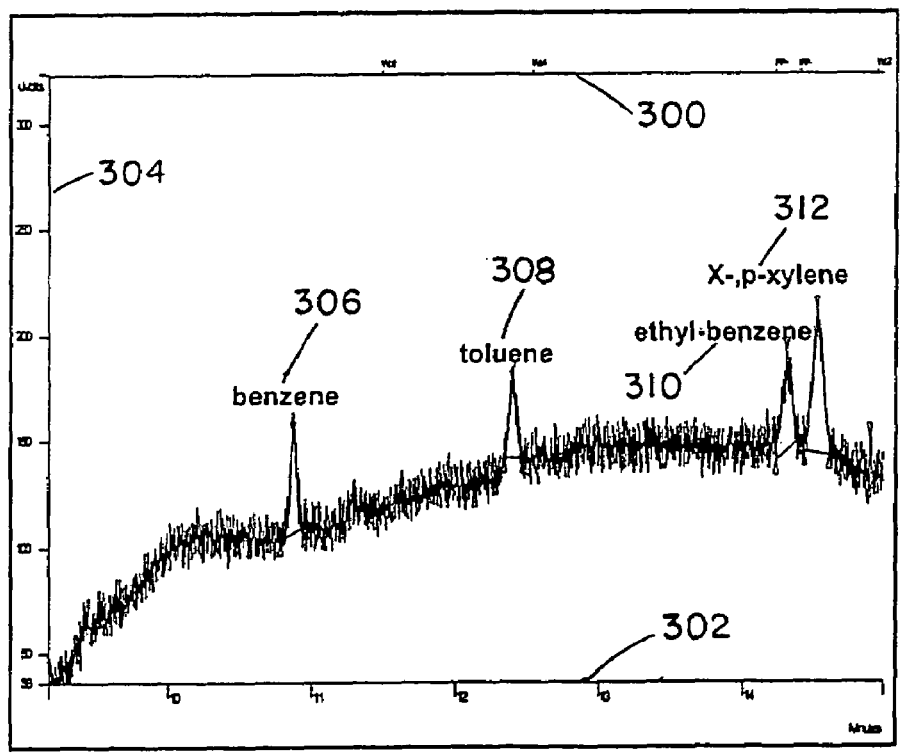
FIG. 3 (Prior Art) is a graph of gas chromatograph detector signal versus time for a sample containing 1 ppt each of various hydrocarbon components.

The practice of purging UHP components and gas delivery systems in fabs has been common for many years. Purging and cleaning of equipment and substrates is also required in a number of other fields including, but not limited to, microelectronics, aerospace, optics for cleaning equipment such as LCD substrates, nanostructure surfaces, wafers, reticles and optical assemblies. Highly purified nitrogen and argon (less than 1 ppb oxygen, water vapor, CO, $CO_2$, and hydrocarbons) have generally been used as purge gases during the "dry down" of these components. The "dry down" process has been so named because the main purpose of the purging with nitrogen or argon was to remove adsorbed surface impurities such as water and oxygen.

Purge gases are typically inert. Removal of contaminants may occur by different mechanisms. During the purge process, contaminants diffuse into the purge gas and are carried away in the flow of the gas stream by reaching an equilibrium between the contaminant concentration in the purge gas and on the surfaces. This requires large volumes of UHP gases sufficiently clean to absorb contaminants at very low levels, typically ppb.

Contaminant species adsorbed onto silicon or stainless steel surfaces can also be desorbed by a kinetic effect. This takes place when a purge gas at high flow rate bombards the surface and collides with the adsorbed species. Kinetic energy may be transferred during the collision which can lead to desorption. In the above processes, there is nothing to prevent contaminants from readsorbing to the surfaces.

The present invention provides a potential new paradigm for the purging contaminants from silicon or stainless steel surfaces. It is proposed that in addition to kinetic energy, non-inert molecules such as oxygen and water, may exhibit a chemical effect. This is where oxygen or water, because of their electronegative and polarized nature respectively, has a strong affinity for the electropositive surface of the silicon or stainless steel and forms a weakly bound absorbed thin layer. Once a collision leads to desorption, re-adsorption of the contaminant species is hindered by the oxygen thin layer. In the case of water which forms stronger surface bonds, the thin layer is even more rigid and prevents readsorption. Since nitrogen is less electronegative than oxygen, the thin layer is very weakly bound and less effective. In addition, $N_2$ is lighter than $O_2$; therefore, it may have less of a kinetic effect. This proposed mechanism is not a limitation of the instant invention. Purification and cleaning of components and apparatuses is preferably carried out at temperatures between ambient temperatures (about 20° C.) to about 50° C. Cleaning may be carried out at higher temperatures, up to 100° C. or even 150° C. The temperature used is dependent upon a number of criteria well-known to those skilled in the art including, but not limited to, the thermal tolerance of the components to be cleaned (e.g., foups are typically made of plastic), the volatility of the potential contaminants at various temperatures and the temperatures that the components will be subjected to during the manufacturing process. In one embodiment, the temperature is ambient temperature up to 150° C. In one preferred embodiment, the temperature is in the range of 80° C. to 100° C. In another embodiment, the temperature is in the range of 100° C. to 150° C. when the components being cleaned are stainless steel.

In the instant invention, the effective concentration of oxygen can vary over a wide range, as explained below. The nominal concentration of 17 to 21% oxygen, corresponding to that found in ordinary air, is inclusive in this effective concentration range, solving both the issue of cost and the asphyxiation hazard. Furthermore, these oxygen containing purge gas mixtures can be purified to a high degree, resulting in contaminant levels in the low ppt range. The purification processes known in the current art (generally for purifying oxygen) can be applied to the purification of clean dry air (CDA), a common reagent found in most industrial fab plants, or other oxygen mixtures. Purified air for use in the present invention (i.e. less than 100 ppt contaminants) will be referred to XCDA (extra clean dry air) to clearly distinguish it from CDA, a term commonly used in the art to refer to air with up to 100 ppm contaminant, typically 10-20 ppm contaminant. Purifiers for the preparation of XCDA are manufactured, for example, by Aeronex, Inc., of San Diego, Calif. Methods for preparation of oxygen and oxygen containing gases to sufficient levels of purity are well known to those skilled in the art (e.g. see U.S. Pat. No. 6,391,090, incorporated herein by reference).

The effective concentration of water in the purge gases of the instant invention may vary from about 100 ppm to about 2% in the apparatus to be purged, typically no more than 0.5%. Theoretically higher water concentrations can be used; however, such high concentrations can be impractical for removing from an apparatus before use. Of course, the lower cost and improved safety of the present invention would be of minimal use if the purging effectiveness could not be demonstrated. Since oxygen and water have been historically considered impurities, their use for removal of contaminants is unexpected. It shall be shown that not only are oxygen and/or water mixtures as effective as UHP nitrogen for removing hydrocarbons from surfaces, they actually show improved performance.

Figure 4:
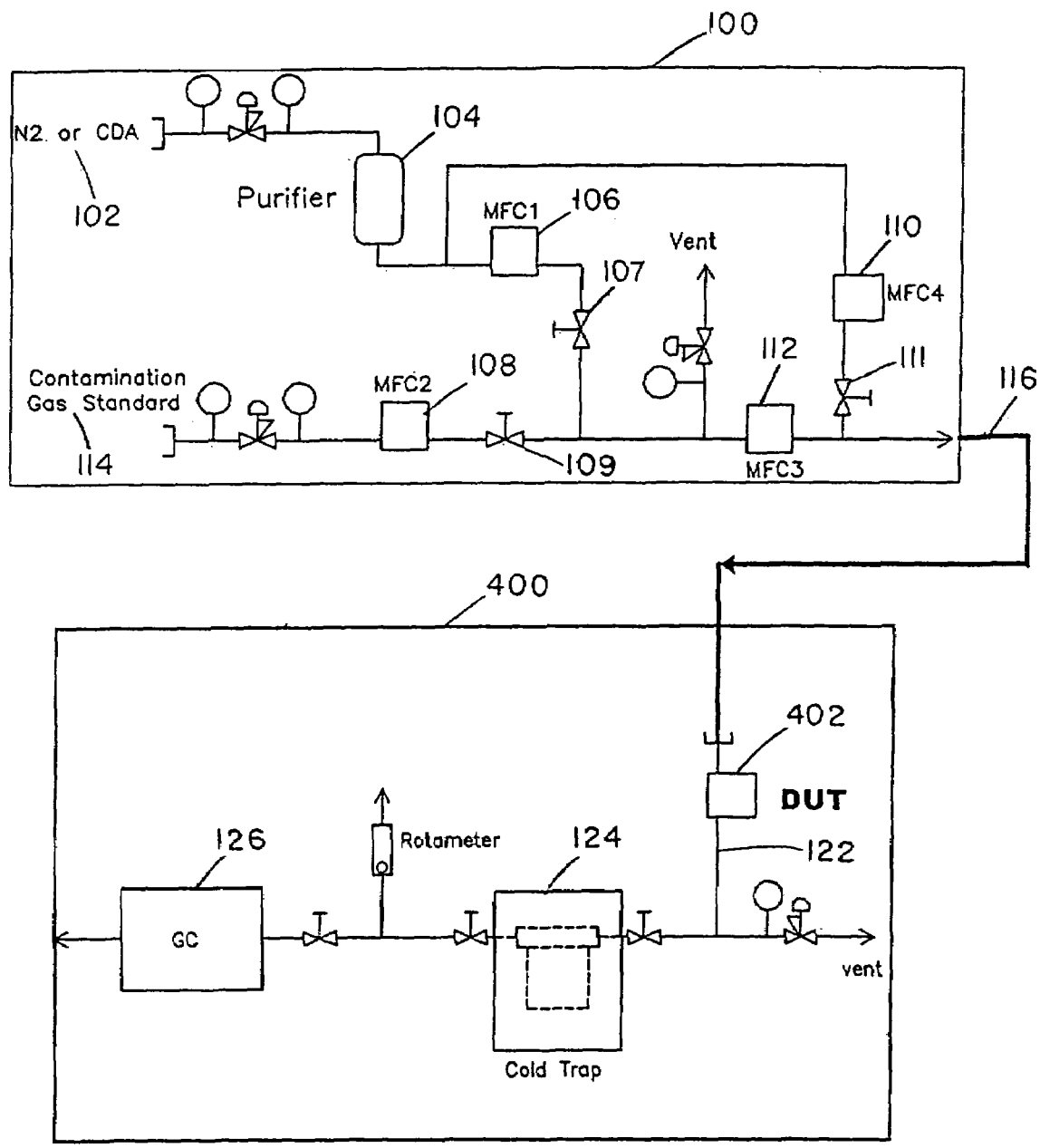
FIG. 4 is a schematic flow diagram of a testing setup according to an embodiment of the present invention.

FIG. 4 is a schematic flow diagram of a testing setup according to an embodiment of the present invention. A double dilution system 100 as described previously is utilized to create known hydrocarbon concentrations from gas standard 114. Concentration curves for other contaminants can be similarly established using methods well known to those skilled in the art. Nitrogen, XCDA, or other oxygen containing mixtures are fed to the carrier input 102. When producing a hydrocarbon mixture to contaminate the surfaces of a test device, nitrogen is chosen at input 102, the hydrocarbon component concentrations being determined by mass flow controllers 108-110 and the concentration of hydrocarbons in gas standard 114. When the purging performance of the purge gas is being evaluated, either nitrogen or a mixture of nitrogen and oxygen are chosen at input 102, with valve 109 closed and valves 107 and/or 111 open. Purifier 104 purifies the nitrogen or nitrogen oxygen mixtures. The gas mixtures created by system 100 are directed to the device under test (DUT) 402. The hydrocarbon concentrations leaving the DUT 402 are introduced into the input 122 of the gas chromatograph gas analysis system 120, where the hydrocarbon levels can be measured, as previously described and known to those skilled in the art.

Generally, the purging effectiveness of the oxygen mixtures was determined by first purging a test device with a hydrocarbon mixture in nitrogen to saturate the surfaces with hydrocarbons, then removing the hydrocarbons in the gas, and continuing the purging process with either UHP nitrogen or purified oxygen mixtures, measuring the hydrocarbon concentrations in the gas leaving the DUT. The faster the hydrocarbon concentration drops in the gas exiting the DUT, the more effective the purging process.

Figure 5:
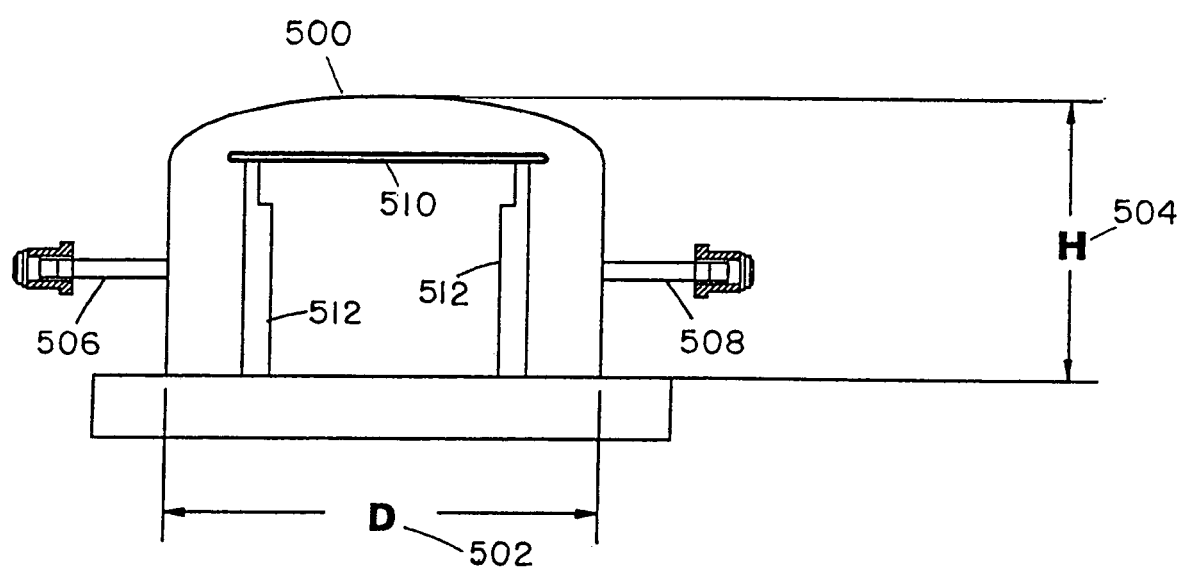
FIG. 5 is a cross section schematic view of a wafer chamber according to an embodiment of the present invention.

FIG. 5 is a cross section schematic view of a wafer chamber 500 according to an embodiment of the present invention. The wafer chamber is used to evaluate the effectiveness of purging hydrocarbons from stainless steel and silicon surfaces. The chamber has an inlet port 506, an outlet port 508, and supports 512 to hold 100 mm diameter silicon substrate 510 in the purge gas environment. The internal surfaces of the wafer chamber are electropolished 316 stainless steel. The wafer chamber diameter D (ref 502) was 6.0 inches, having a height dimension H (ref 504) of 3.9 inches. Wafer chamber 500 was connected as the DUT 402 in the system shown in FIG. 4.

EXAMPLE 1

The effectiveness of removing hydrocarbons from 316 stainless steel electropolished surfaces with oxygen mixtures is demonstrated in this example. 316 stainless steel electropolished surfaces are widely used in UHP gas distribution systems in mass flow controllers, pressure regulators, and interconnecting pipe and tubing. They are also widely used as a process chamber material in semiconductor manufacturing equipment. An empty (no silicon wafer 510 present) wafer chamber 500, was first purged with a nitrogen-hydrocarbon mixture containing approximately 10 ppb each of benzene, toluene, ethyl-benzene, meta/para-xylene, and ortho-xylene for approximately 3.5 hours. Following the hydrocarbon exposure, the wafer chamber was purged with UHP nitrogen and the hydrocarbon concentrations in the purge gas exiting the chamber were measured. The hydrocarbon exposure was then repeated. Following the second hydrocarbon exposure, the wafer chamber was purged with purified XCDA, which contained approximately 20% oxygen by volume.

Figure 6:
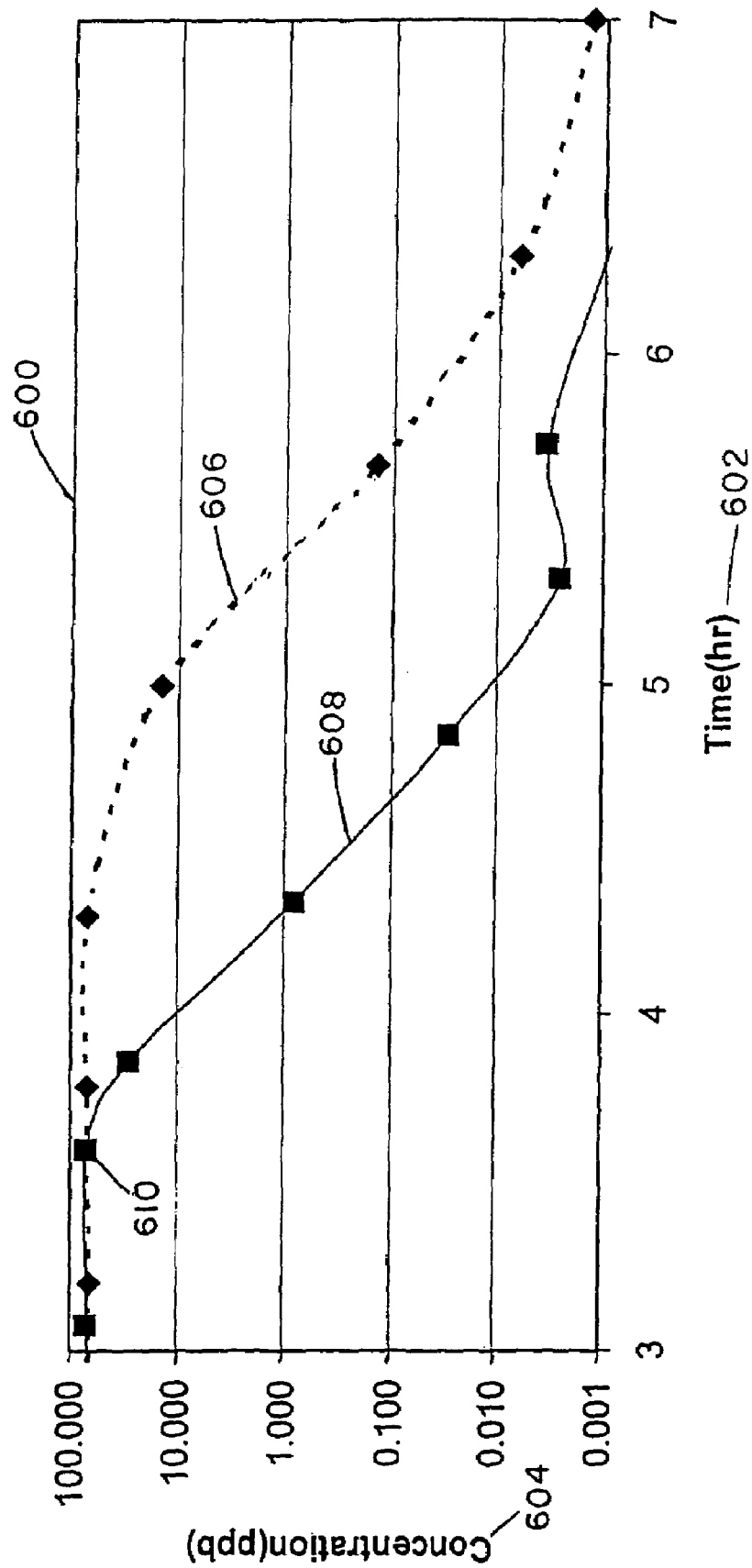
FIG. 6 is a graph of hydrocarbon concentration versus time for two purge gas mixtures exiting the wafer chamber of FIG. 5, with no wafer in the chamber, according to an embodiment of the present invention.

FIG. 6 is a graph 600 of hydrocarbon concentration 604 versus time 602 for two purge gas mixtures exiting the wafer chamber of FIG. 5, with no wafer in the chamber, according to an embodiment of the present invention. Broken curve 606 shows the total concentration decay response of all six hydrocarbons in the purge gas leaving the wafer chamber with a pure nitrogen purge gas. Solid curve 608 shows the total concentration decay response of all six hydrocarbons in the purge gas leaving the wafer chamber with a purified XCDA purge gas. Ref 610 indicates the point where the hydrocarbon containing purge gas was substituted for the nitrogen or XCDA. As can be seen from the relative position of the two curves 606 and 608, the XCDA is more effective at removing the hydrocarbons contaminating the stainless steel surfaces of the wafer chamber, since the purge times to reach a given final hydrocarbon concentration are shorter with the XCDA.

The elution times of the hydrocarbons in curves 606 and 608 were compared to the time it would take to dilute the original 60 ppb hydrocarbon concentration to 10 ppt, given the wafer chamber volume of approximately 1.5 liters and purge flow rate of 0.75 liters/min. For a uniformly mixed system, it would take about 8.7 time constants to reduce an initial 60 ppb concentration to 10 ppt. The time constant is defined as the wafer chamber volume divided by the purge flow rate. At a time constant of approximately two minutes, simple dilution would take under 20 minutes to reach 10 ppt from an initial starting point of 60 ppb. The actual time for either the CDA or pure nitrogen to reach 10 ppt is considerably longer, indicating that removal from the internal stainless steel surfaces is dominating the hydrocarbon elution from the wafer chamber. Other tests have shown that once the hydrocarbons are reduced to very low levels (10 ppt and below) by purified XCDA, subsequent purging by UHP nitrogen does not produce hydrocarbon concentrations above the levels last obtained with the XCDA.

EXAMPLE 2

Figure 7:
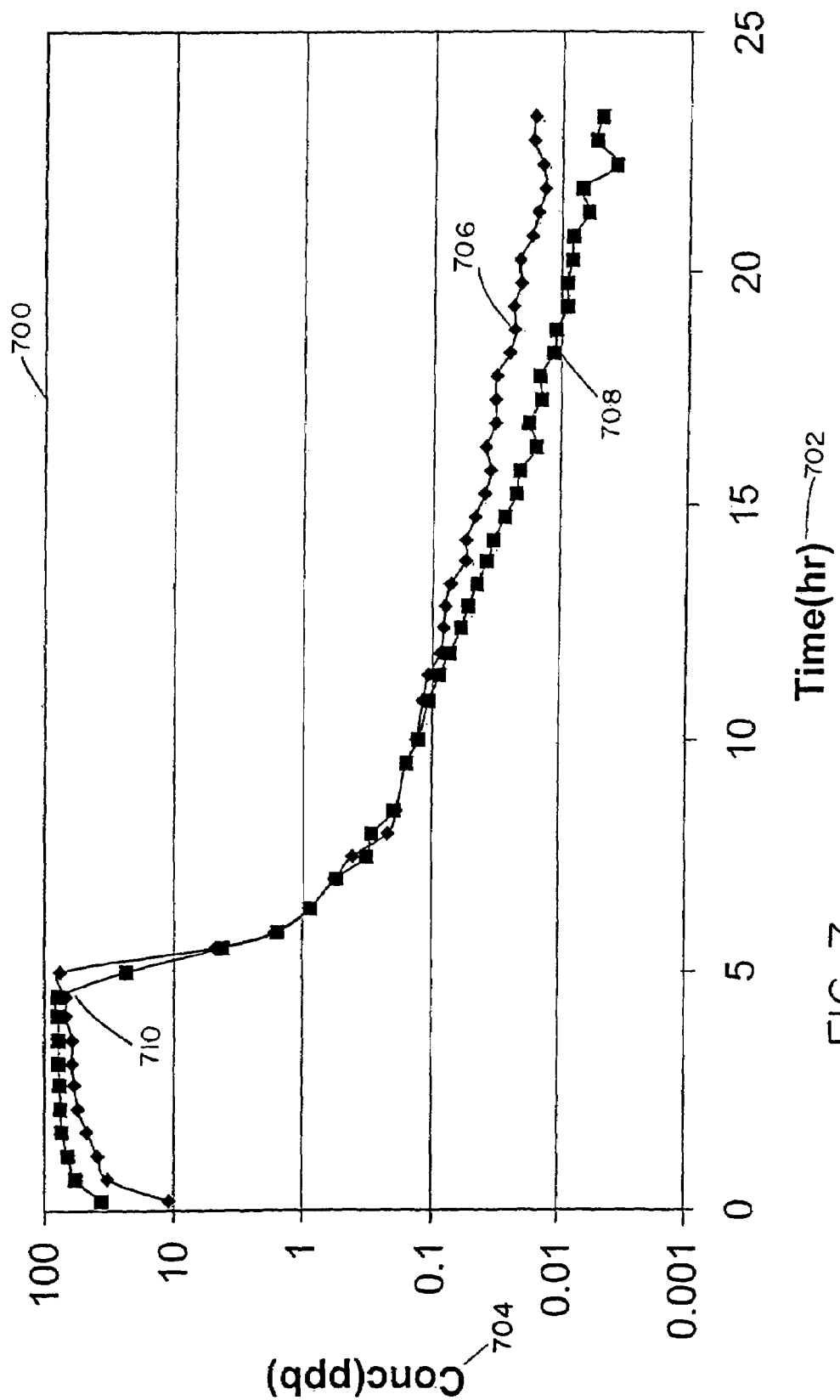
FIG. 7 is a graph of hydrocarbon concentration versus time for two purge gas mixtures exiting the wafer chamber of FIG. 5, with a silicon wafer in the chamber, according to an embodiment of the present invention.
Figure 8:
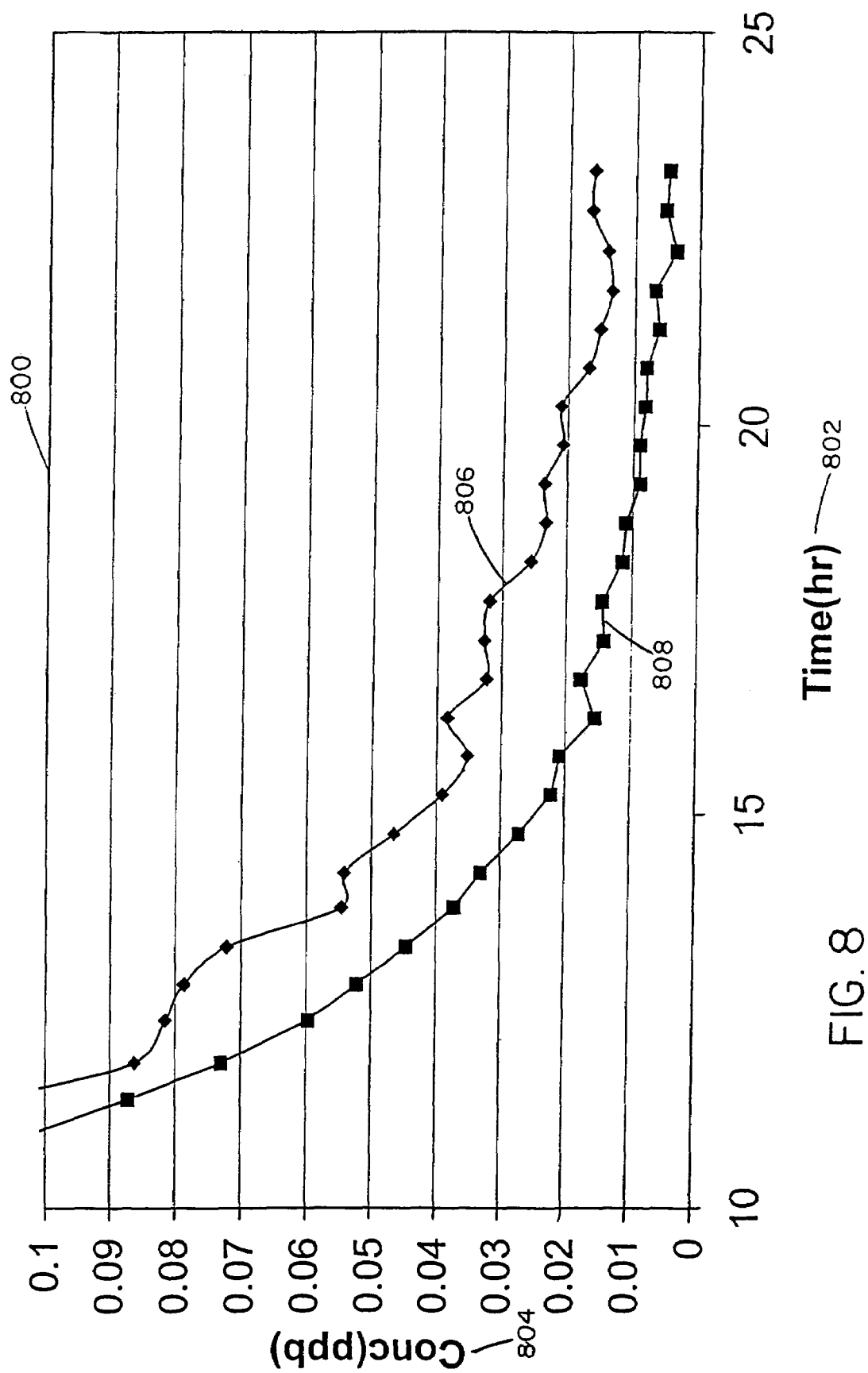
FIG. 8 is an expanded version of FIG. 7, showing the time span from 10 hrs to 25 hrs in greater detail, according to an embodiment of the present invention.

In this example, the test described in Example 1 was repeated, with the exception that a bare 100 mm (4 inch) silicon substrate 510 was placed in the wafer chamber 500 prior to exposure to the nitrogen-hydrocarbon mixture. FIG. 7 is a graph 700 of total hydrocarbon concentration 704 versus time 702 for two purge gas mixtures exiting the wafer chamber of FIG. 5, with a silicon wafer in the chamber, according to an embodiment of the present invention. Curve 706 shows the decay in hydrocarbon concentration while the wafer chamber and wafer are purged with UHP nitrogen. Curve 708 shows the decay in hydrocarbon concentration while the wafer chamber and wafer are purged with purified XCDA. Ref 710 indicates the approximate point where feed of nitrogen-hydrocarbon mixture was terminated. Curves 706 and 708 clearly indicate hydrocarbon removal from silicon substrates is significantly slower than the stainless steel surfaces of the wafer chamber. As in the previous Example 1, the oxygen containing purge gas (curve 708) shows a more rapid reduction in hydrocarbon concentration, when compared to UHP nitrogen (curve 706). FIG. 8 is an expanded version of FIG. 7, showing the time span from 10 hrs to 25 hrs in greater detail. Here it can be more clearly seen from graph 800 that hydrocarbon concentration 804 versus time 802 for the XCDA purge (curve 808) is in advance of the UHP nitrogen curve 806. At the 20 ppt concentration level, the UHP nitrogen response lags the XCDA response by nearly 5 hours. This, of course, means that it would require 5 hours longer to purge the wafer chamber and wafer to the 20 ppt level with UHP nitrogen.

EXAMPLE 3

Figure 9:
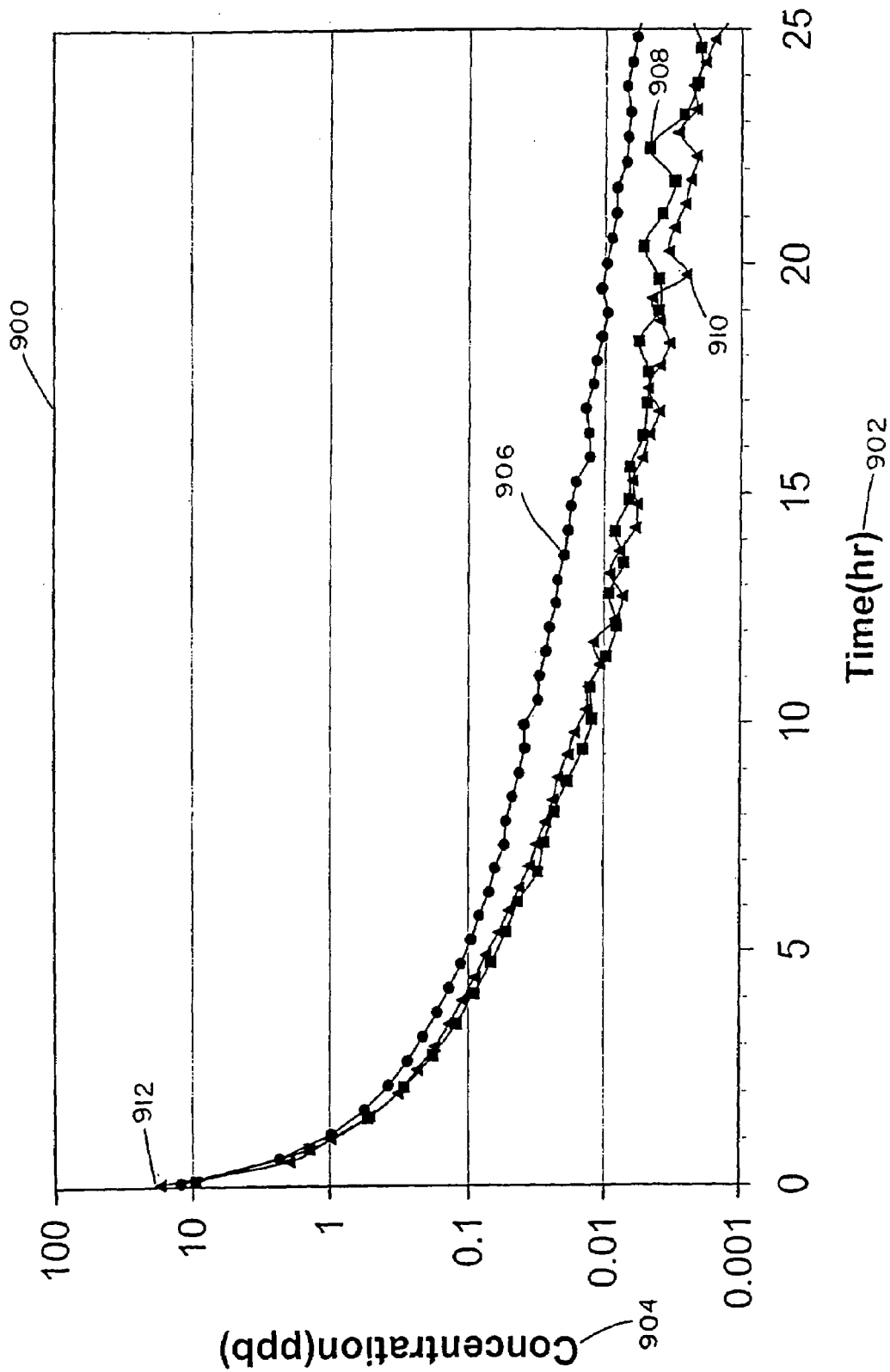
FIG. 9 is a graph of m, p-xylene concentration versus time for three purge gas mixtures exiting the wafer chamber of FIG. 5, with a silicon wafer in the chamber, the purge gasses containing 0%, 1%, and 20% oxygen, according to an embodiment of the present invention.
Figure 10:
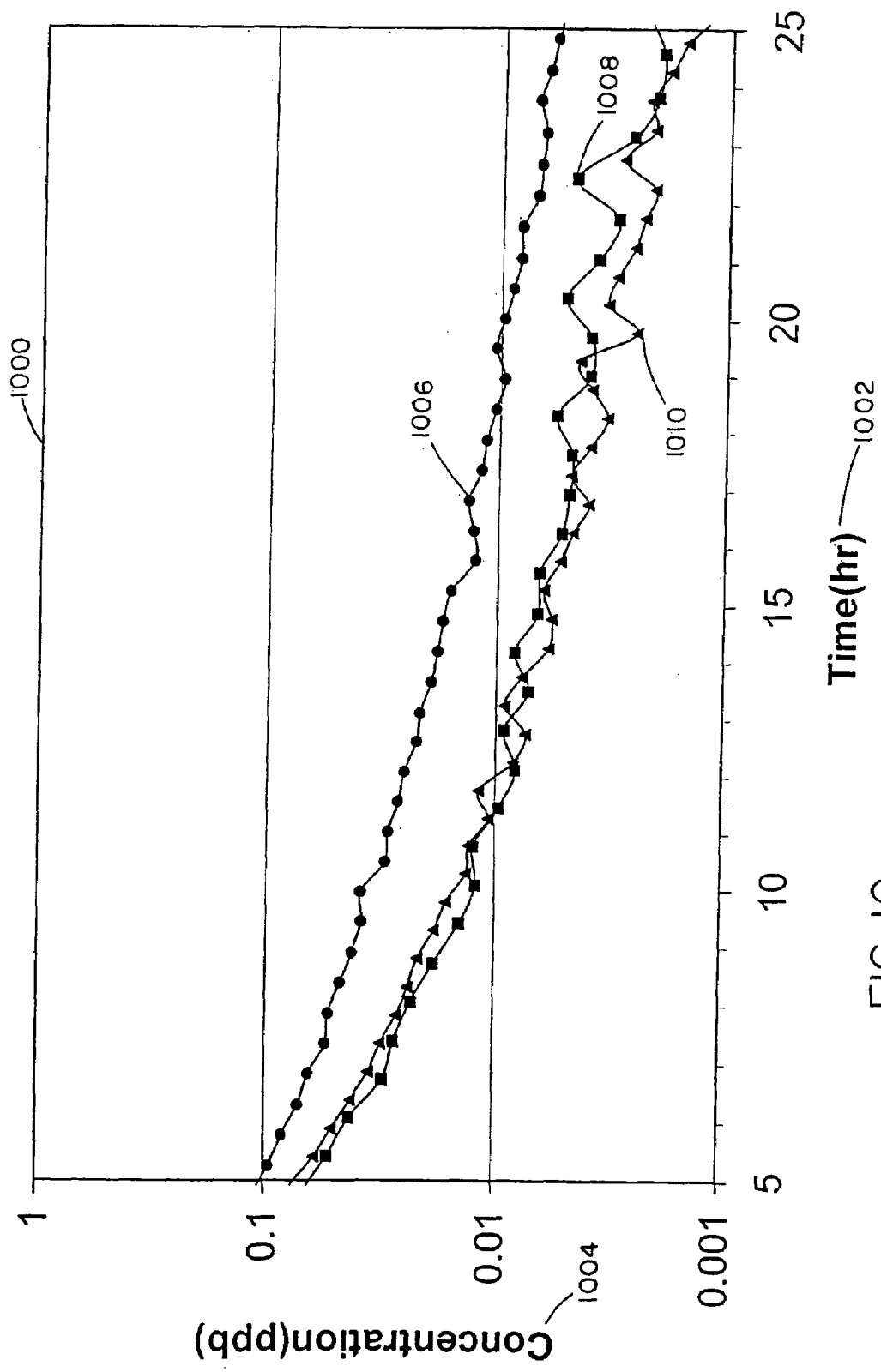
FIG. 10 is an expanded version of FIG. 9, showing the time span from 5 hrs to 25 hrs in greater detail, according to an embodiment of the present invention.

FIG. 9 is a graph 900 of m, p-xylene concentration 904 versus time 902 for three purge gas mixtures exiting the wafer chamber of FIG. 5, with a silicon wafer in the chamber, the purge gasses containing 0%, 1%, and 20% oxygen, according to an embodiment of the present invention. In this example, 1% oxygen and 20% oxygen (in nitrogen) are compared to UHP nitrogen. The hydrocarbon mixture used was approximately 10 ppb of meta-xylene and 10 ppb of para-xylene in nitrogen. As in Example 2, a silicon substrate was placed in the wafer chamber prior to the hydrocarbon exposure. Curve 906 in FIG. 9 shows the concentration response of both xylenes as a function of time during a UHP nitrogen purge. Curve 908 shows the concentration response of both xylenes as a function of time during a 1% oxygen (by volume) in nitrogen purge. Curve 910 shows the concentration response of both xylenes as a function of time during a 20% oxygen (by volume) in nitrogen (XCDA) purge. Ref 912 indicates the point at which the hydrocarbon feed gas was terminated. FIG. 10 is an expanded version of FIG. 9, showing the time span from 5 hrs to 25 hrs in greater detail. Here it can be more clearly seen from graph 1000 that hydrocarbon concentration 1004 versus time 1002 for the 1% oxygen purge gas (curve 1008) and the 20% oxygen purge gas (curve 1010) is in advance of the UHP nitrogen curve 1006. From a comparison of the three curves 1006-1010, it can be noted that 1% oxygen is as effective as 20% for hydrocarbon levels above 10 ppt, but that the higher oxygen concentration has a slight advantage at levels below 10 ppt. Both oxygen containing purge gasses demonstrate a significant advantage over purging with UHP nitrogen.

EXAMPLE 4

Figure 11:
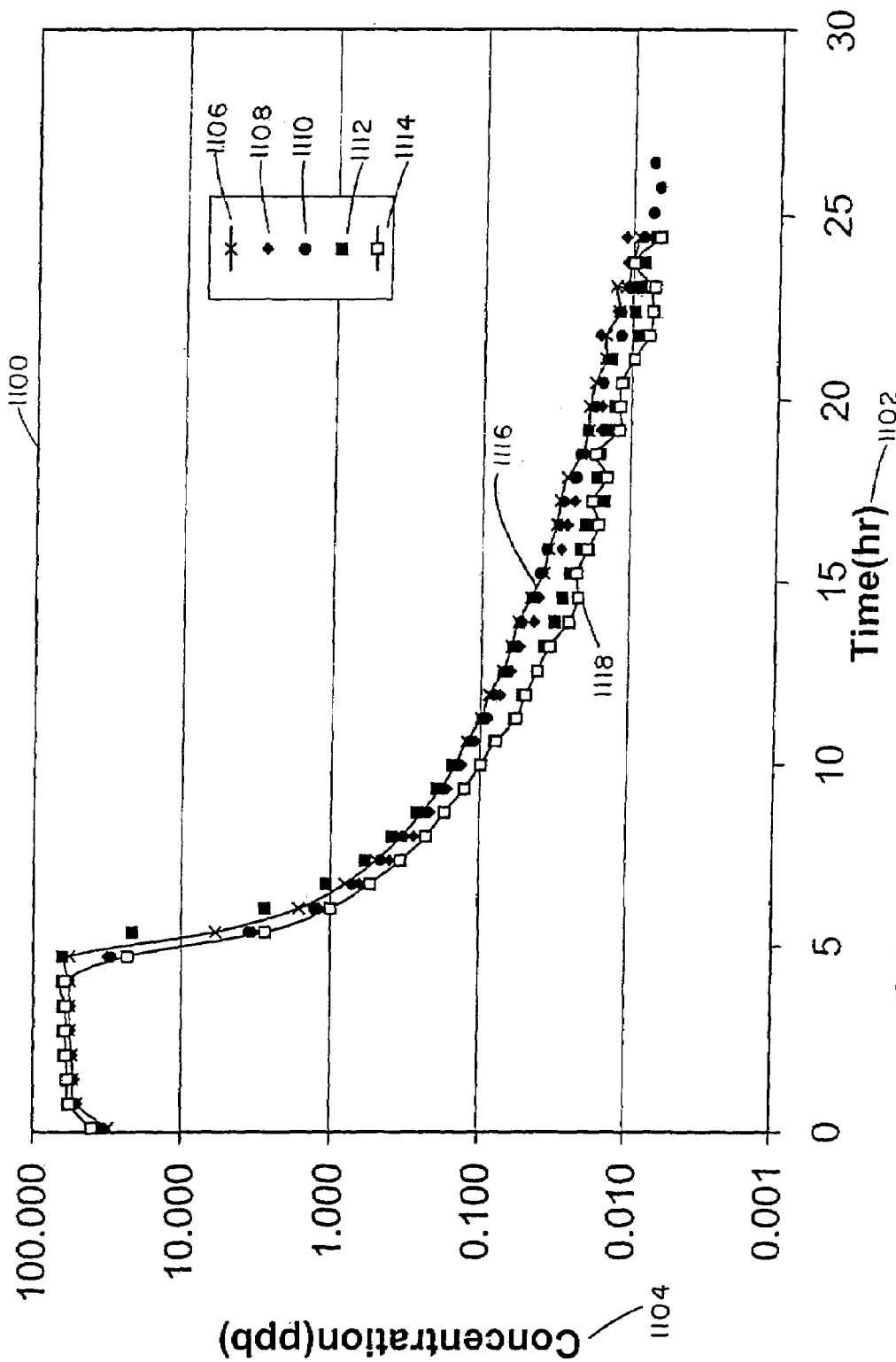
FIG. 11 is a graph of hydrocarbon concentration versus time for five purge gas mixtures exiting the wafer chamber of FIG. 5, with a silicon wafer in the chamber, the purge gasses containing 0%, 0.001%, 0.01%, 0.1%, and 1.0% oxygen, according to an embodiment of the present invention.
Figure 12:
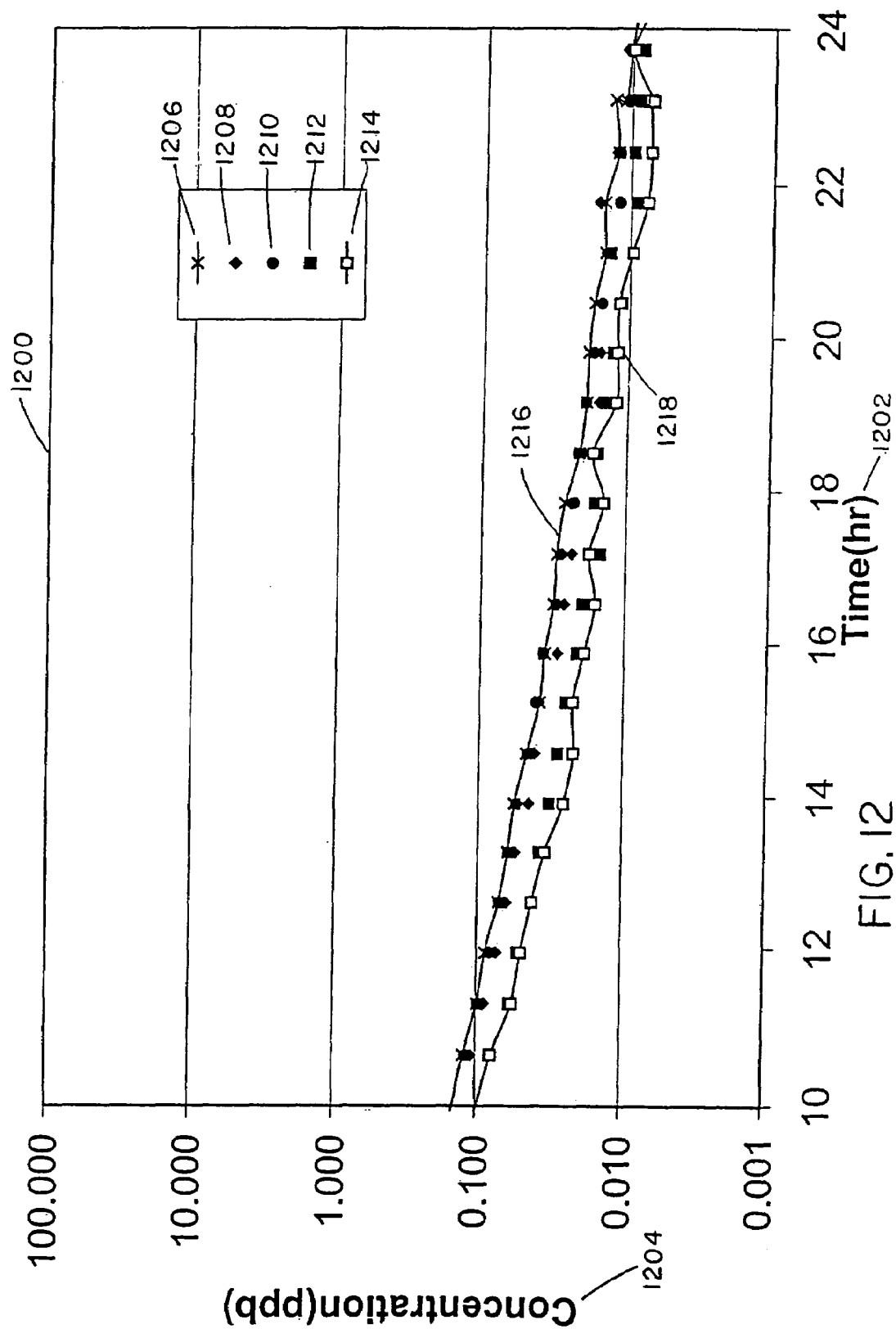
FIG. 12 is an expanded version of FIG. 11, showing the time span from 10 hrs to 24 hrs in greater detail, according to an embodiment of the present invention.

FIG. 11 is a graph 1100 of hydrocarbon concentration 1104 versus time 1102 for five purge gas mixtures exiting the wafer chamber of FIG. 5, with a silicon wafer in the chamber, the purge gasses containing 0%, 0.0001%, 0.01%, 0.1%, and 1.0% oxygen, according to an embodiment of the present invention. The hydrocarbon-nitrogen contamination mixture was 60 ppb total hydrocarbon concentration, as described in Example 1. Data representing the purge response of UHP nitrogen (ref 1106, curve 1116), 0.0001% oxygen (by volume) in nitrogen 1108, 0.01% oxygen (by volume) in nitrogen 1110, 0.1% oxygen (by volume) in nitrogen 1112, and 1% oxygen (by volume) in nitrogen (ref 1114, curve 1118) are plotted in graph 1100. All the data fall between the 0% oxygen curve 1116 (UHP nitrogen) and the 1% oxygen curve 1118, as might be expected. Purging effectiveness increases as oxygen concentration increases within the ranges of oxygen concentration shown. FIG. 12 is an expanded version of FIG. 11, showing the time span from 10 hrs to 24 hrs in greater detail. The graph 1200 of hydrocarbon concentration 1204 versus time 1202 is plotted with data representing the purge response of UHP nitrogen (ref 1206, curve 1216), 0.0001% oxygen 1208, 0.01% oxygen 1210, 0.1% oxygen 1212, and 1% (ref 1214, curve 1218).

EXAMPLE 5

Figure 13:
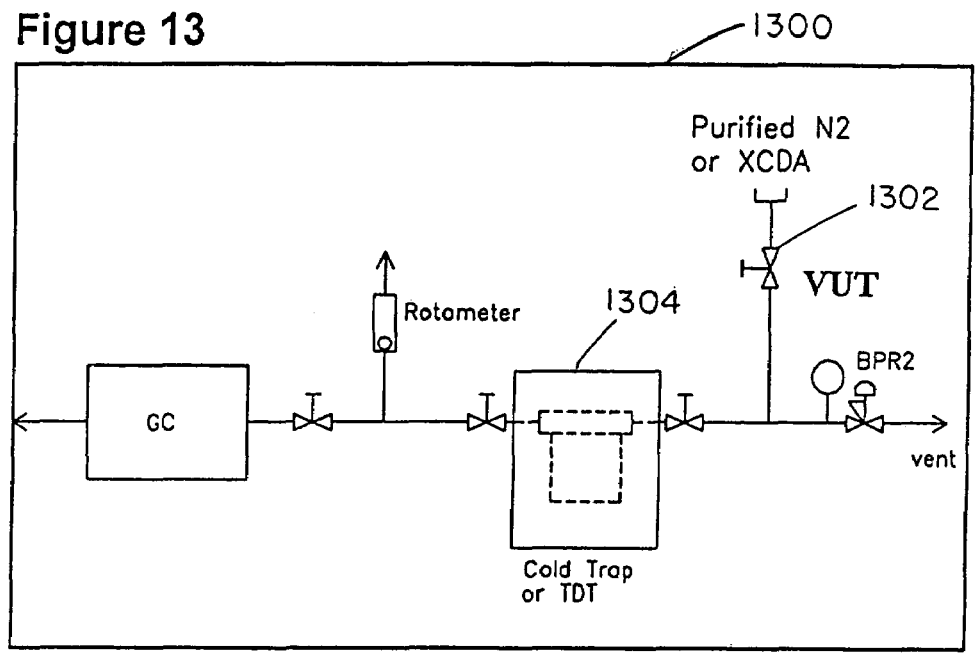
FIG. 13 is a schematic flow diagram of the testing setup according to an embodiment of the invention.

In a comparative test to determine the efficacy of XCDA as compared to nitrogen for decontamination of UHP equipment, a quantitative measurement system was assembled incorporating three commercial UHP diaphragm valves, each from a different manufacturer. The setup is shown in FIG. 13, 1300. To perform outgassing tests, each valve under test 1302, VUT, was connected directly upstream of the cold trap 1304 as shown. Purified sample gas (N2 or XCDA) was sent through each VUT with a gas purity specification of less than 1 ppt hydrocarbon. The supply N2 and XCDA were purified with an inert purifier (Aeronex, SS-500KF-I-4R) and optics purifier (Aeronex, SS-700KF-O-4R) respectively. A heater tape and temperature probe were wrapped around the VUT to heat and monitor the temperature (not shown). As the gas purged through the VUT, any desorbed contaminants were collected downstream in the cold trap for hydrocarbon analysis in the gas chromatogram 1304.

Figure 14:
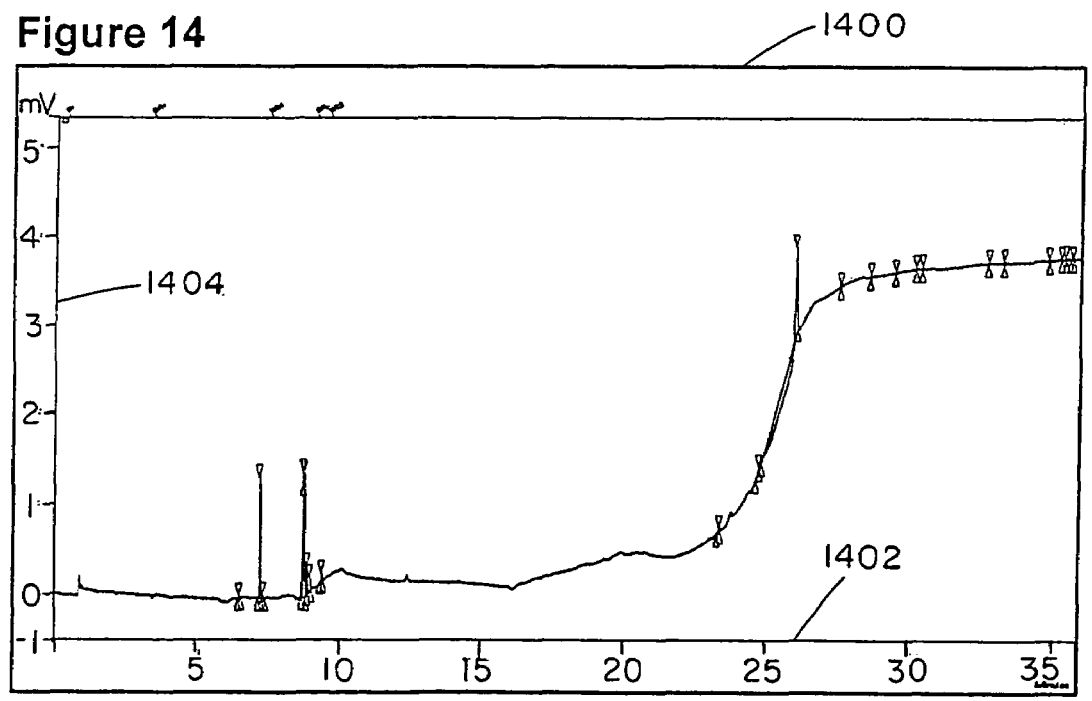
FIG. 14 is a chromatograph of typical valve outgasing immediately after installation.
Figure 15:
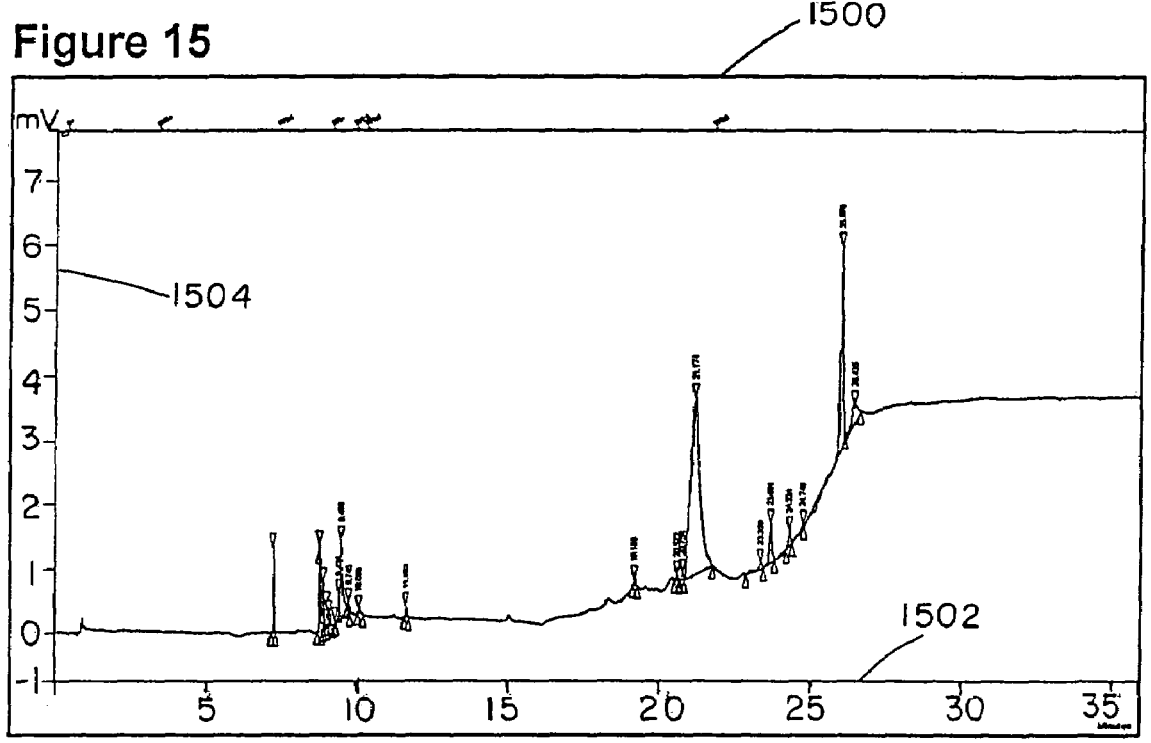
FIG. 15 is a chromatograph of typical valve outgassing at 80° C.

Valves were selected as representative of UHP system contamination sources since prior investigations had shown evidence of hydrocarbon contamination being generated by outgassing from elastomeric components in the valves. Detection and measurement was by means of cold trap collection and gas chromatographic measurement. The size of the contaminants was determined by retention time on the column (TOC) as compared to known standards. Chromatographs 1400 and 1500 showing time in minutes 1402 and 1502 versus m Volts 1404 and 1504, respectively from the outgassing of valves at two different temperatures, ambient and about 80° C., are shown in FIGS. 14 and 15. A rough analysis of the size of the contaminants based on the chromatographs is presented in Table 1 below.

TABLE 1

Analysis of contaminants by TOC

| Time | Compound | % outgassing |
|---|---|---|
| <10 min | <5 carbons | 10-20% |
| 10-16 min | 6-10 carbons | 0-5% |
| 16-25 min | 11-15 carbons | 20-40% |
| >25 min | >15 carbons | 50-80% |

It should be noted that the majority of the contaminants released are high molecular weight contaminants. This is in contrast to the prior examples where purging of low molecular weight hydrocarbons (i.e. Lee than 8 carbons) was analyzed.

Measurements were made at 0 and 60 minutes of system operation at ambient temperature (approximately 20° C.) and at 0, 60 and 720 minutes at 80° C. Measurements were made of both one-pass and two-pass purges by the different gases. In each case a nitrogen purge was followed by an XCDA purge. In the two-pass test the XCDA purge was followed by a second nitrogen purge. Tests of the three different UHP valves produced three different results. One valve started out with a low level on hydrocarbon outgassing and did not exceed 100 ppt even during elevated thermal XCDA testing, while another produced temperature sensitive contamination results. The remaining valve started out at 100 and peaked at 1000 ppt. On the positive side all valves through proper purging and thermal cycling where able to achieve levels at or below the 1 ppt lower limit of the detection capability of our test instruments. This indicates that through proper preconditioning any of these valves could be used in UHP piping system to deliver 1 ppt gas to the process. Results for the valve producing the 100-1000 ppt outgassing were as shown below in Table 2.

TABLE 2

Nitrogen vs. XCDA Purging of UHP Valves

| No. of Passes | Time (minutes) | Temperature (C.) | Nitrogen (ppt) | | XCDA (ppt) |
|---|---|---|---|---|---|
| 1 | 0 | Ambient | 100 | | 50 |
| 1 | 60 | Ambient | 180 | | 50 |
| 1 | 0 | 80 | 1000 | | 40 |
| 1 | 60 | 80 | 700 | | 100 |
| 1 | 720 | 80 | 12 | | 0 |
| | | | 1st | 2nd | |
| 2 (N2) | 0 | Ambient | 100 | 0 | 50 |
| 2 (N2) | 60 | Ambient | 180 | 0 | 50 |
| 2 (N2) | 0 | 80 | 1000 | 0 | 40 |
| 2 (N2) | 60 | 80 | 700 | 0 | 100 |
| 2 (N2) | 720 | 80 | 12 | 0 | 0 |

It will be evident from the data of Table 2 that over all of the temperature and time ranges, purges with nitrogen produced only limited and quite unacceptable reductions of the hydrocarbon contamination of the valve. The subsequent purge with the XCDA reduced the hydrocarbon contaminant level to much lower levels, bettering the nitrogen purge lower limit by factors of 2-25. Further the XCDA purges to the low levels occurred in very short times as compared to the time required for the nitrogen purges to effect significant reductions. (The increases seen for the first nitrogen purge at ambient temperature and the XCDA purge at 80° C. between 0 and 60 minutes are believed to be due to the time required for some hydrocarbon contaminants within the elastomeric components to migrate to the surface for purging. This is a physical phenomenon of the elastomeric materials of the valve and not of the purge capabilities of the respective gases.)

The generally accepted protocol for UHP gas line validation requires extensive purging with nitrogen followed by verification that the line is contaminant free in a nitrogen purge environment. However, with all the valves XCDA volatilized additional hydrocarbons which remain after UHP nitrogen cleaning and thermal cycling. Even at ambient temperature, additional hydrocarbons were released when exposed to an oxygen rich purge gas.

A second series of tests were conducted to determine any effect from the order in which the purge gases were used. Two equivalent commercial valves from the same manufacturer were tested for hydrocarbon decontamination. One (A1) was purged with nitrogen followed by XCDA, and the other (A2) with XCDA followed by nitrogen. The results are presented in Table 3 below

TABLE 3

Nitrogen/XCDA Purge vs. XCDA/Nitrogen Purge

| Time (minutes) | Temperature (° C.) | Valve A1 | | Valve A2 | |
|---|---|---|---|---|---|
| | | N2 (ppt) | XCDA (ppt) | XCDA (ppt) | N2 (ppt) |
| 0 | ambient | 50 | 50 | 50 | 90 |
| 60 | ambient | 10 | 190 | 19 | 9 |
| 0 | 80 | 220 | 220 | 510 | 2 |
| 60 | 80 | 200 | 100 | 35 | 2 |
| 720 | 80 | 10 | 5 | 0 | 0 |

The XCDA step at ambient temperature produced results similar to the nitrogen purge. However, when Valve A2 was heated to 80° C. under XCDA purge, the hydrocarbon outgassing rate increased; significantly and then dropped quickly to below the limits of the detection equipment. Repeating the test in nitrogen showed little improvement. When purging with nitrogen, UHP components produced a continuous release of hydrocarbons. Actual peak values often did not occur until long after the initiation of purging due to the slow migration of heavier hydrocarbons through the piping system.

EXAMPLE 6

The effectiveness of removing hydrocarbons from 316 stainless steel electropolished surfaces with water mixtures is demonstrated in this example using a method similar to that in Example 1. Initially purified nitrogen gas was mixed with six components hydrocarbon gas standard (benzene, toluene, ethylbenzene, xylenes; BTEX) to create a known challenge of 60 ppb total organic compounds (TOC). The wafer chamber was purged with the challenge gas under standard operating conditions of 0.75 slm, 30 psig and ambient temperature. The wafer chamber effluent was measured for hydrocarbon level using a gas chromatograph with a flame ionization detector until its concentration reached 60 ppb$\pm$2 ppb hydrocarbon. The stabilization time for the chamber to condition occurred after 4-5 hours.

After the wafer chamber was saturated with the 60 ppb TOC, the BTEX challenge was turned off and moisture or oxygen was added to the nitrogen gas stream as indicated. The wafer chamber effluent was monitored until its TOC concentration dried down below the 10 ppt level for each contaminant.

Figure 16:
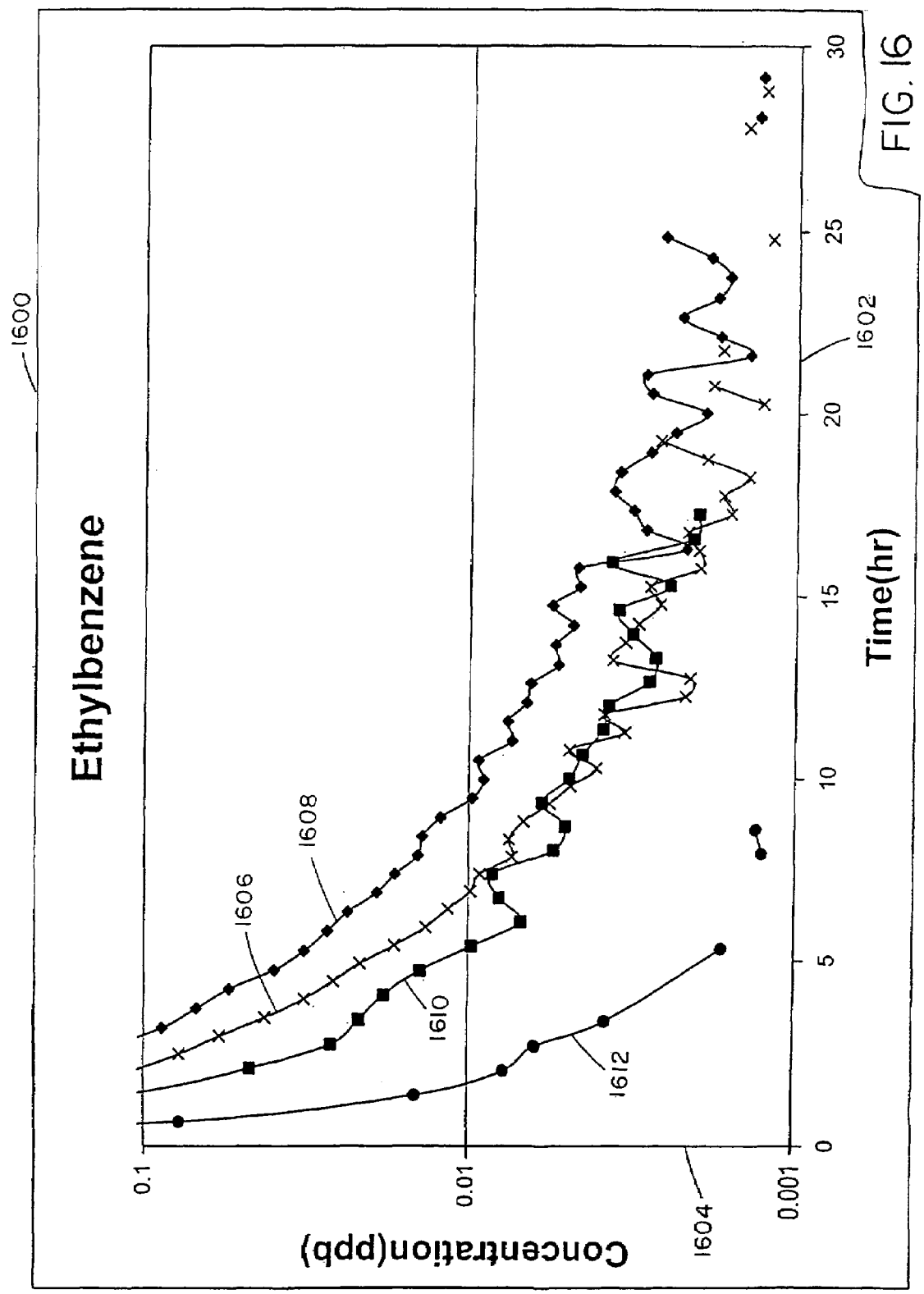
FIG. 16 is a graph of ethylbenzene concentration versus time for four purge gas mixtures exiting the wafer chamber of FIG. 5, the purge gases containing 20% oxygen in nitrogen, 100% nitrogen, 0.5% water in nitrogen and 100 ppm water in nitrogen.

FIG. 16 is a graph 1600 of time 1602 versus ethylbenzene concentration 1604 for four purge gas mixtures exiting the wafer chamber of FIG. 5, the purge gasses containing 100% nitrogen, 20% oxygen, 0.5% water and 100 ppm water according to an embodiment of the present invention. The hydrocarbon-nitrogen contamination mixture was 60 ppb total hydrocarbon concentration, as described in Example 6. Data representing the purge response of ethylbenzene to UHP nitrogen 1608, 20% oxygen (by volume) in nitrogen 1606, 100 ppm water (by volume) in nitrogen 1610 and 0.5% water (by volume) in nitrogen 1612 are plotted in graph 1600. Purging effectiveness increases as water concentration increases within the ranges of water concentration shown.

Figure 17:
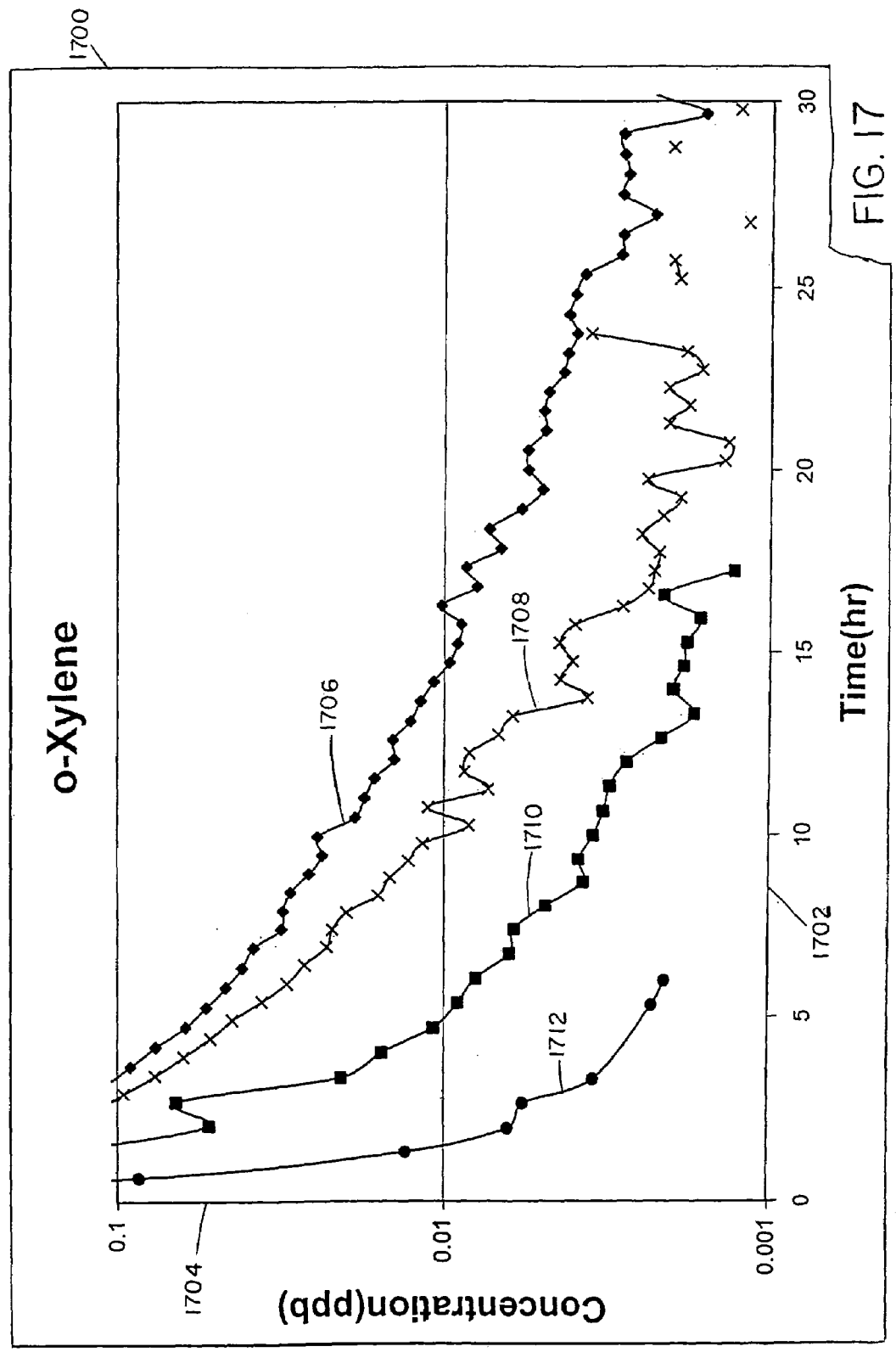
FIG. 17 is a graph of combined orthoxylene concentration versus time for four purge gas mixtures exiting the wafer chamber of FIG. 5, the purge gases containing 20% oxygen in nitrogen, 100% nitrogen, 0.5% water in nitrogen and 100 ppm water in nitrogen.

FIG. 17 is a graph 1700 of time 1702 versus o-xylene concentration 1704 for four purge gas mixtures exiting the wafer chamber of FIG. 5, the purge gasses containing 100% nitrogen, 20% oxygen, 0.5% water and 100 ppm water according to an embodiment of the present invention. The hydrocarbon-nitrogen contamination mixture was 60 ppb total hydrocarbon concentration, as described in Example 6. Data representing the purge response of o-xylene to UHP nitrogen 1706, 20% oxygen (by volume) in nitrogen 1708, 100 ppm water (by volume) in nitrogen 1710 and 0.5% water (by volume) in nitrogen 1712 are plotted in graph 1700. Purging effectiveness increases as water concentration increases within the ranges of water concentration shown.

Figure 18:
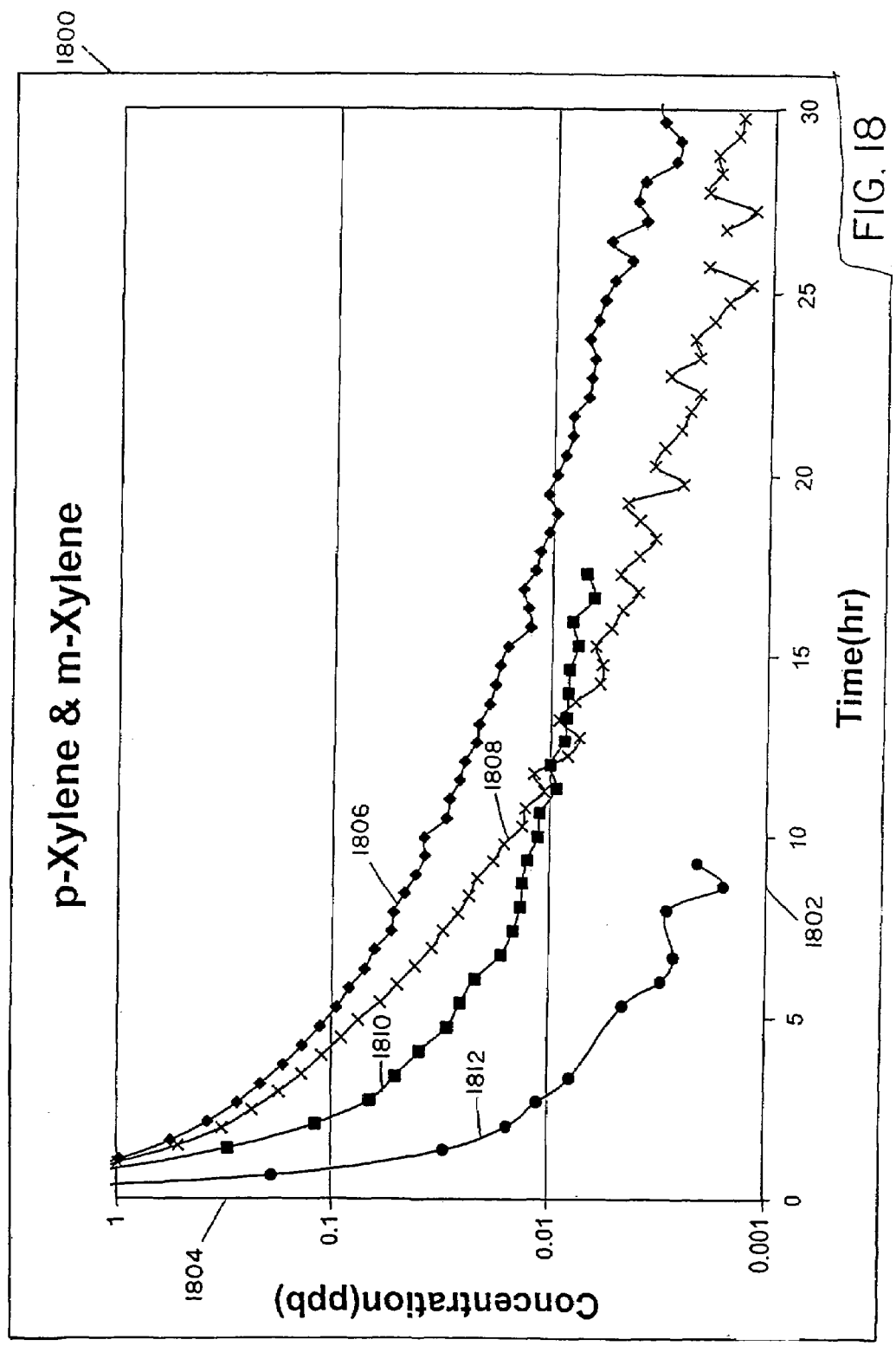
FIG. 18 is a graph of p-xylene and m-xylene versus time for four purge gas mixtures exiting the wafer chamber of FIG. 5, the purge gases containing 20% oxygen in nitrogen, 100% nitrogen, 0.5% water in nitrogen and 100 ppm water in nitrogen.

FIG. 18 is a graph 1800 of time 1802 versus p- and m-xylene 1804 for four purge gas mixtures exiting the wafer chamber of FIG. 5, the purge gasses containing 100% nitrogen, 20% oxygen, 0.5% water and 100 ppm water according to an embodiment of the present invention. The hydrocarbon-nitrogen contamination mixture was 60 ppb total hydrocarbon concentration, as described in Example 6. Data representing the purge response of p- and m-xylene to UHP nitrogen 1806, 20% oxygen (by volume) in nitrogen 1808, 100 ppm water (by volume) in nitrogen 1810 and 0.5% water (by volume) in nitrogen 1812 are plotted in graph 1600. Purging effectiveness increases as water concentration increases within the ranges of water concentration shown.

Figure 19:
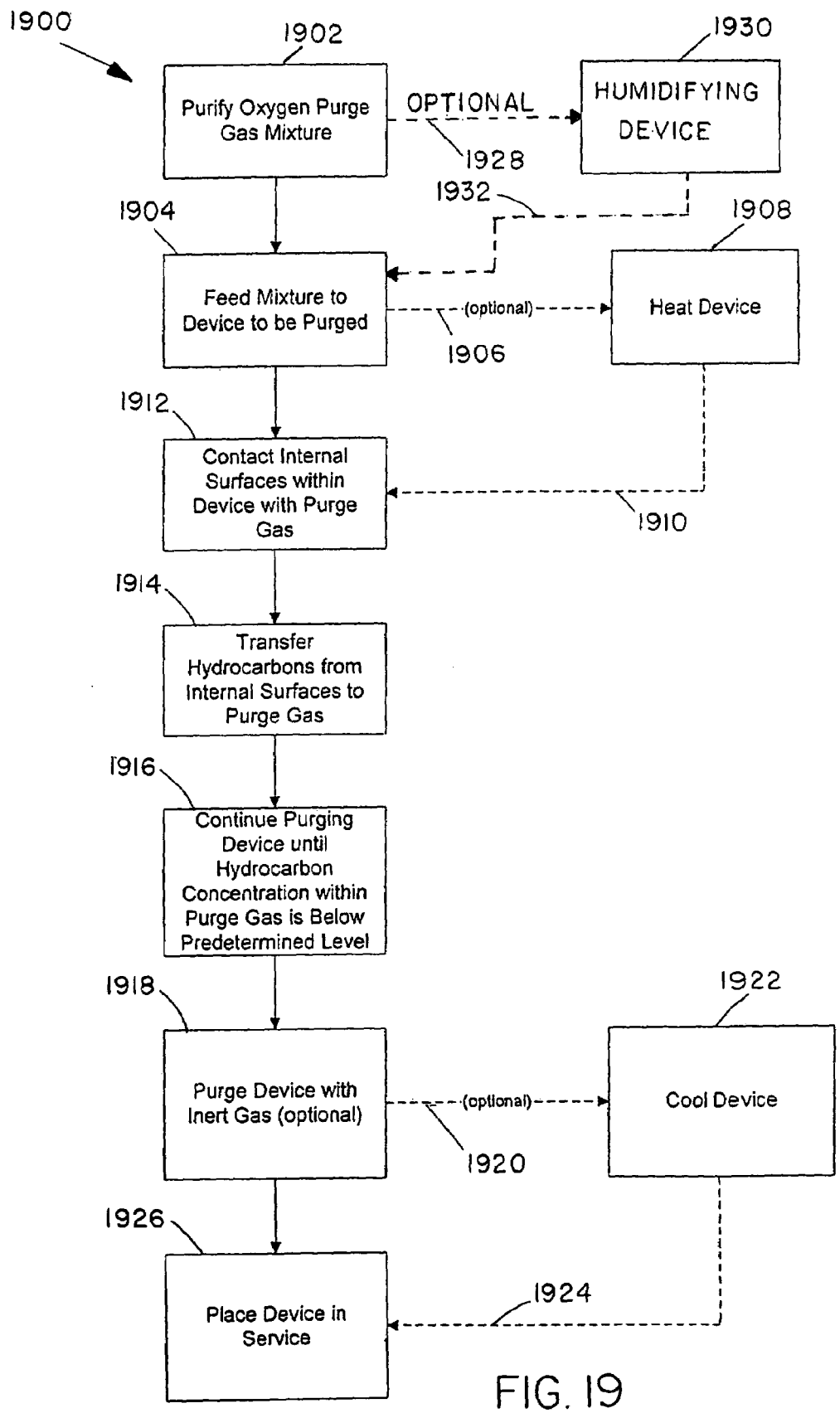
FIG. 19 is a process block diagram of a first purging process according to an embodiment of the present invention.

FIG. 19 is a process block diagram 1900 of a first purging process according to an embodiment of the present invention. The process begins with step 1902, wherein a purge gas mixture containing oxygen is purified. Moisture, when added, is typically added to the oxygen containing gas mixture after purification with step 1928 by passage through a humidifying device 1930. Moisture may be added by any method known to those skilled in the art (e.g. a bubbler). However, methods that allow careful control of the amount of moisture added are preferred. A number of types of calibrated tubing with defined water permeabilities are known to those skilled in the art and are commercially available. Tubes are made of nylon, silicon, Teflon® (poly (ethylene tetraflouride); PTFE) and Nafion® (Dupont). The purified purge gas is passed through a chamber through which the tubing containing ultrapure water (less than 1 ppb contaminants) runs. The amount of moisture entering the purified purge gas can be determined for a specific flow rate of both water and purge gas. Such methods are well known to those skilled in the art. The humidified purge gas is delivered to the device in step 1932.

The purified gas mixture is comprised of oxygen in a concentration between 99 volume % and 0.0001 volume %, preferably between 25 volume % and 0.1 volume %, and more preferably between 21 volume % and 1.0 volume %. Additionally, the purge gas contains water vapor at 100 ppm to 2%, preferably 100 ppm to 0.5%. The remainder of the mixture should be an inert gas chosen from among the group of nitrogen, the noble gasses, carbon dioxide, and methane. Preferably, nitrogen should be the major inert component, with all other components of the inert gas being present at below about 1 volume %. Preferably, the levels of non-methane hydrocarbons, volatile bases, volatile acids, refractory compounds, and volatile metal compounds should be below 1 ppb. Preferably, the levels of contaminants should be below 100 ppt, more preferably below 10 ppt, most preferably below 1 ppt. The specific purification means is well known to those skilled in the art.

In step 1904, the purified purge gas containing oxygen and/or water is fed to the device to be purged. Optionally, the device may be heated in step 1908 to reduce the purge time. If heating is employed, the process proceeds along paths 1906 and 1910 to step 1912. In step 1912, a portion of the internal surfaces are contacted with the oxygen and/or water containing purge gas. In step 1914, a portion of the contaminants present on the internal surfaces of the device are transferred to the purge gas, creating a contaminated purge gas. Surfaces contained within the device being purged may be metal, metal oxides, silicon, silicon oxides, ceramics, or plastics. Preferably, the surfaces are electropolished stainless steel, silicon, and oxides of silicon. Also in step 1914, the contaminated purge gas is removed from the device. In step 1916, the purging process is continued until the contaminant concentration in the purge gas is below a predetermined limit. This limit may be less than 1 ppb, preferably less than 100 ppt, more preferably less than 10 ppt, most preferably less than 1 ppt. In a preferred optional step 1918, the oxygen and water containing purge gas may be removed by purging with a dry gas including oxygen, nitrogen or other inert gas to remove the water which is incompatible with a number of high purity applications. In optional step 1918, the oxygen containing purge gas may be removed by purging with nitrogen or another inert gas, if the device is to be placed into service where oxygen may be considered undesirable. If the device was heated, the device should be cooled in step 1922 and returned to service in step 1926 via paths 1920 and 1924.

Figure 20:
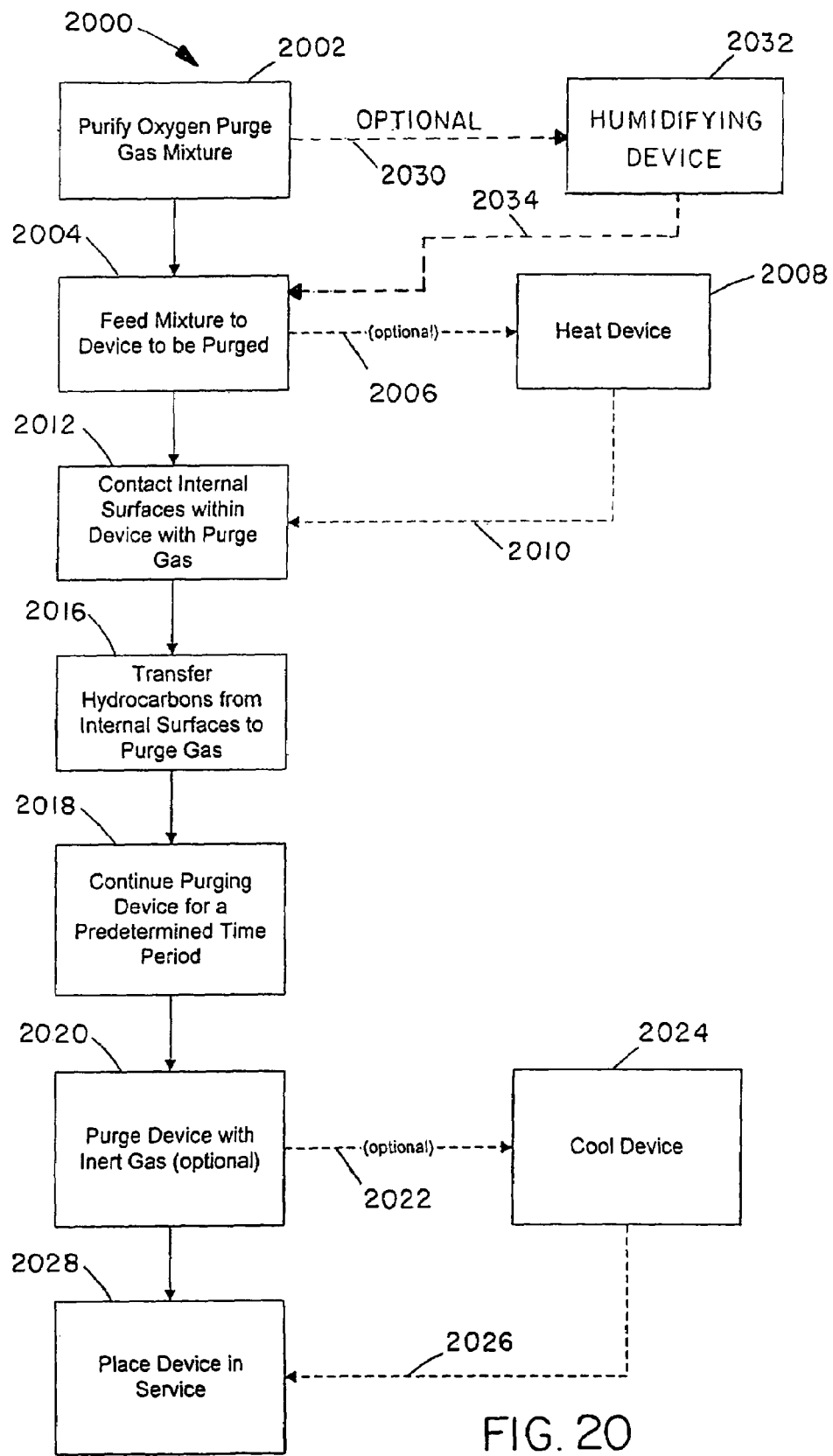
FIG. 20 is a process block diagram of a second purging process according to an embodiment of the present invention; and, FIG. 21 is a process block diagram of a third purging process according to an embodiment of the present invention.

FIG. 20 is a process block diagram 2000 of a second purging process according to an embodiment of the present invention. The process begins with step 2002, wherein a purge gas mixture containing oxygen is purified. The requirements for the inert gas are as described above. Purification means to obtain such high purity gases are well known to those skilled in the art. In step 2004, the purified purge gas containing oxygen is optionally fed, in step 2030, to a humidifying device 2032 and returned in step 2034 to be fed to the device to be purged. Optionally, the device may be heated in step 2008 to reduce the purge time. If heating is employed, the process proceeds along paths 2006 and 2010 to step 2012. In step 2012, a portion of the internal surfaces are contacted with the oxygen and/or water containing purge gas. In step 2016, a portion of the contaminants present on the internal surfaces of the device are transferred to the purge gas, creating a contaminated purge gas. Surfaces contained within the device being purged may be metal, metal oxides, silicon, silicon oxides, ceramics, or plastics. Preferably, the surfaces are electropolished stainless steel, silicon, and oxides of silicon. Also in step 2016, the contaminated purge gas is removed from the device. In step 2018, the purging process is continued for a predetermined time period. This may be more convenient than basing the purge time on the measurement of contaminant concentration, which requires complex and sensitive analytical equipment. In a preferred optional step 2020, the oxygen and water containing purge gas may be removed by purging with a dry gas including oxygen, nitrogen or other inert gas to remove the water which is incompatible with a number of high purity applications. If the device is to be placed into service where oxygen may be considered undesirable, nitrogen or inert gas should be used for the post-cleaning purge. If the device was heated, the device should be cooled in step 2024 and returned to service in step 2028 via paths 2022 and 2026.

Figure 21:
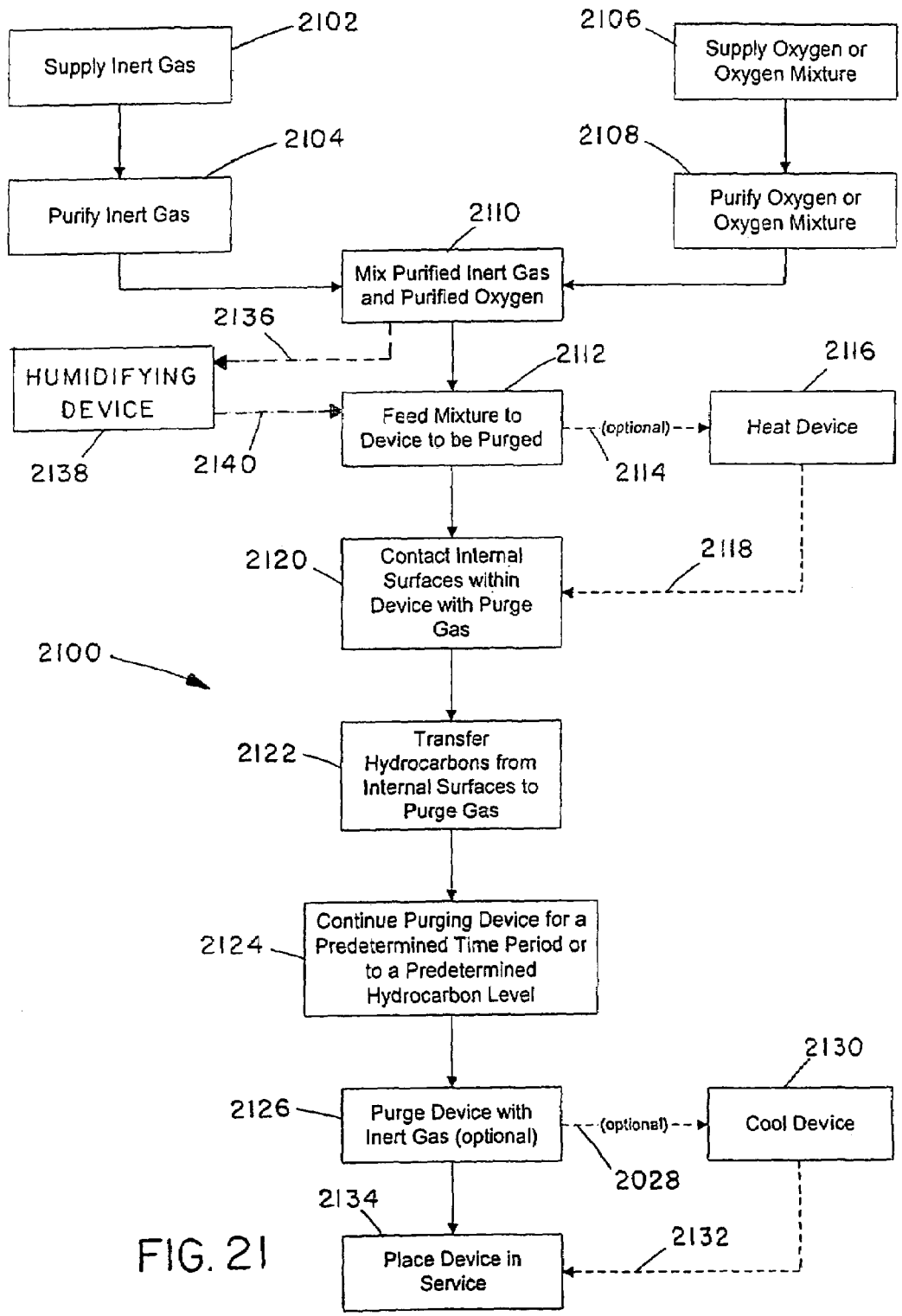

FIG. 21 is a process block diagram 2100 of a third purging process according to an embodiment of the present invention. In step 2102, an inert gas is supplied. The requirements for the inert gas are as described above. In step 2104, the inert gas is purified via a process or processes well known to those skilled in the art. In step 2106, essentially pure oxygen or a mixture containing oxygen is supplied. In step 2108, the oxygen or oxygen mixture is purified as well known to those skilled in the art. In step 2110, the purified oxygen or oxygen mixture from step 2108 is combined with the purified inert gas from step 2104. Optionally, the purification stages may be performed after the combining of the gasses in step 2110. After step 2110, the purified purge gas containing oxygen is optionally fed, in step 2136, to a humidifying device 2138 and returned in step 2140, so that the purified purge gas containing oxygen and/or water is fed to the device to be purged. Optionally, the device may be heated in step 2116 to reduce the purge time. If heating is employed, the process proceeds along paths 2114 and 2118 to step 2120. In step 2120, a portion of the internal surfaces are contacted with the oxygen containing purge gas. In step 2122, a portion of the hydrocarbons contaminating the internal surfaces of the device are transferred to the purge gas, creating a hydrocarbon contaminated purge gas. Surfaces contained within the device being purged may be metal, metal oxides, silicon, silicon oxides, ceramics, or plastics. Preferably, the surfaces are electropolished stainless steel, silicon, and oxides of silicon. Also in step 2122, the hydrocarbon purge gas is removed from the device. In step 2124, the purging process is continued for a predetermined time period, or to a predetermined hydrocarbon level. This level may be less than 100 ppt, but is preferably less than 10 ppt. In a preferred optional step 2126, the oxygen and water containing purge gas may be removed by purging with a dry gas including oxygen, nitrogen or other inert gas to remove the water which is incompatible with a number of high purity applications. If the device is to be placed into service where oxygen may be considered undesirable, nitrogen or inert gas should be used for the post-cleaning purge. If the device was heated, the device should be cooled in step 2130 and returned to service in step 2134 via paths 2128 and 2132.

What is claimed is:

1. A method for the removal of airborne molecular contaminants (AMC) from a substrate, comprising:
providing a humidified purified purge gas which has been humidified by the addition of water thereto, the humidified purified purge gas having a contaminant concentration of less than about 1 part per billion (ppb) on a volume basis of at least one of the contaminants selected from the group consisting of sulfur oxides, nitrogen oxides, Si-containing organics, organophosphates, amines, $SiO_2$ compounds, $PO_4$ compounds; and non-methane hydrocarbons;
contacting at least a portion of the substrate with the humidified purified purge gas under conditions that do not chemically change the AMC;
producing a contaminated purge gas by transferring AMC from the substrate into the humidified purified purge gas; and
removing the contaminated purge gas from the substrate, thereby removing AMC from the substrate.

2. The method of claim 1 wherein the amount of water in the humidified purified purge gas is less than about 100 parts per million on a volume basis.

3. The method of claim 1 wherein the AMC includes at least one of hydrocarbons, Si-containing organics, $NO_x$, $SO_x$, and amines.

4. The method of claim 1 wherein the amount of water in the humidified purified purge gas is at least about 100 parts per million on a volume basis.

5. The method of claim 1 wherein the steps of contacting and producing are performed at a temperature above ambient temperature.

6. The method of claim 1 further comprising purging of the substrate with an inert gas after removing the contaminated purge gas from the substrate.

7. The method of claim 1 wherein the substrate is enclosed within a chamber.

8. The method of claim 1 wherein the substrate is contaminated with AMC before the substrate is contacted with the humidified purified purge gas.

9. The method of claim 1 wherein the steps of contacting and producing are performed at ambient temperature.

10. The method of claim 1 further comprising removing water from the substrate with a dry purge gas after the AMCs are removed from the substrate by the purified purge gas comprising water.

11. The method of claim 1 wherein the water in the humidified purified purge gas is in a concentration sufficient to remove the AMC from the substrate at a faster rate than the same method using an ultra-high purity (UHP) nitrogen purge gas in lieu of the humidified purified purge gas.

12. The method of claim 1 wherein the portion of the substrate is contacted with the humidified purified purge gas under temperature conditions that do not chemically change the AMC.

13. The method of claim 1 wherein the portion of the substrate is contacted with the humidified purified purge gas at a temperature of about 20° C. to 100° C.

14. The method of claim 5 wherein the amount of water in the humidified purified purge gas is at least about 100 parts per million on a volume basis.

15. The method of claim 6 wherein the inert gas includes at least one of nitrogen, argon, noble gases, and methane.

16. The method of claim 7 wherein the substrate includes at least one silicon substrate.

17. The method of claim 7 wherein the substrate includes a wafer.

18. A method for the removal of airborne molecular contaminants (AMC) from a wafer, comprising:
providing a purified purge gas, wherein the purified purge gas comprises water, the purified purge gas having a contaminant concentration of less than about 1 part per billion (ppb) on a volume basis of at least one of the contaminants selected from the group consisting of sulfur oxides, nitrogen oxides, Si-containing organics, organophosphates, amines, volatile bases, volatile acids, refractory compounds, volatile metal compounds; and non-methane hydrocarbons;
contacting at least a portion of the wafer with the purified purge gas under temperature conditions that do not chemically change the AMC;
producing a contaminated purge gas by transferring AMC from the wafer into the purified purge gas; and
removing the contaminated purge gas from the wafer, wherein the water in the purified purge gas is in an amount sufficient to remove AMC from the wafer at a faster rate than the same method using an ultra-high purity (UHP) nitrogen purge gas in lieu of the purified purge gas.

19. A method for the removal of airborne molecular contaminants (AMC) from a substrate, comprising:
adding water to purified air, the purified air having a contaminant concentration of less than about 1 part per billion (ppb) on a volume basis of at least one of the contaminants selected from the group consisting of sulfur oxides, nitrogen oxides, Si-containing organics, organophosphates, amines, $SiO_2$ compounds, $PO_4$ compounds; and non-methane hydrocarbons, thereby forming a humidified purge gas;
contacting at least a portion of the substrate with the humidified purge gas at a temperature of about 20° C. to 100° C.;
producing a contaminated purge gas by transferring AMC from the substrate into the humidified purge gas; and
removing the contaminated purge gas from the substrate; thereby removing AMC from the substrate.

20. The method of claim 19 wherein water is added to the purified air at a concentration sufficient to remove AMC from the substrate at a faster rate than the same method using an ultra-high purity (UHP) nitrogen purge gas in lieu of the humidified purge gas.

21. The method of claim 19 wherein the substrate includes a wafer.

22. The method of claim 19 wherein the substrate includes a wafer processing or storage chamber.

23. A method for the removal of airborne molecular contaminants (AMC) from a substrate, comprising:
adding water to a purified gas, the purified gas having a contaminant concentration of less than about 1 part per billion (ppb) on a volume basis of at least one of the contaminants selected from the group consisting of sulfur oxides, nitrogen oxides, Si-containing organics, organophosphates, amines, $SiO_2$ compounds, $PO_4$ compounds; and non-methane hydrocarbons, thereby forming a humidified purge gas;
contacting at least a portion of the substrate with the humidified purge gas insert under conditions that do not chemically change the AMC;

producing a contaminated purge gas by transferring AMC from the substrate into the humidified purge gas, wherein the humidified purge gas includes water; and removing the contaminated purge gas from the substrate, thereby removing AMC from the substrate.

24. The method of claim 23 wherein water is added to the purified gas at a concentration sufficient to remove AMC from the substrate at a faster rate than the same method using an ultra-high purity (UHP) nitrogen purge gas in lieu of the purified purge gas.

* * * * *

UNITED STATES PATENT AND TRADEMARK OFFICE
CERTIFICATE OF CORRECTION

PATENT NO. : 7,377,982 B2 Page 1 of 1
APPLICATION NO. : 11/113726
DATED : May 27, 2008
INVENTOR(S) : Daniel Alvarez, Jr. and Jeffrey J. Spiegelman It is certified that error appears in the above-identified patent and that said Letters Patent is hereby corrected as shown below:

Col. 16 Claim 23, line 66, delete "insert"

Signed and Sealed this

Twenty-sixth Day of August, 2008

JON W. DUDAS
*Director of the United States Patent and Trademark Office*